(12) United States Patent
Kim et al.

(10) Patent No.: US 12,331,236 B2
(45) Date of Patent: Jun. 17, 2025

(54) LAYERED STRUCTURES AND ELECTRONIC DEVICES INCLUDING THE SAME

(71) Applicant: SAMSUNG ELECTRONICS CO., LTD., Suwon-si (KR)

(72) Inventors: Tae Gon Kim, Hwaseong-si (KR); Deukseok Chung, Yongin-si (KR); Jooyeon Ahn, Suwon-si (KR); Shin Ae Jun, Seongnam-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 968 days.

(21) Appl. No.: 17/356,721

(22) Filed: Jun. 24, 2021

(65) Prior Publication Data

US 2021/0324263 A1     Oct. 21, 2021

Related U.S. Application Data

(63) Continuation of application No. 16/223,186, filed on Dec. 18, 2018, now Pat. No. 11,046,885.

(30) Foreign Application Priority Data

Dec. 18, 2017    (KR) ........................ 10-2017-0174587

(51) Int. Cl.
    *C09K 11/02*      (2006.01)
    *C08G 77/04*      (2006.01)
    (Continued)

(52) U.S. Cl.
    CPC ............ *C09K 11/025* (2013.01); *C08G 77/04* (2013.01); *C08G 77/28* (2013.01); *C08G 77/38* (2013.01);
    (Continued)

(58) Field of Classification Search
None
See application file for complete search history.

(56) References Cited

U.S. PATENT DOCUMENTS

| | | |
|---|---|---|
| 7,476,487 B2 | 1/2009 | Park et al. |
| 7,746,423 B2 | 6/2010 | Im et al. |
| (Continued) | | |

FOREIGN PATENT DOCUMENTS

| | | |
|---|---|---|
| CN | 103080081 A | 5/2013 |
| CN | 103228983 A | 7/2013 |
| (Continued) | | |

OTHER PUBLICATIONS

Office Action dated Nov. 15, 2022 of the corresponding Chinese Patent Application No. 201811553215.0.
(Continued)

*Primary Examiner* — Eli D. Strah
(74) *Attorney, Agent, or Firm* — CANTOR COLBURN LLP

(57) ABSTRACT

A layered structure including a photoluminescent layer including a quantum dot polymer composite; a light absorption layer disposed on the photoluminescent layer, the light absorption layer including an absorptive color-filter material; and a silicon containing layer disposed between the photoluminescent layer and the light absorption layer, wherein the quantum dot polymer composite includes a first polymer matrix and a plurality of quantum dots dispersed in the first polymer matrix, and the plurality of quantum dots absorb excitation light and emits light in a longer wavelength than the wavelength of the excited light; and the absorptive color-filter material is dispersed in a second polymer matrix, and the absorptive color-filter material absorbs the excitation light that passes through the photoluminescent layer and transmits the light emitted from the
(Continued)

plurality of quantum dots and an electronic device including the same.

20 Claims, 11 Drawing Sheets

(51) Int. Cl.
  *C08G 77/28*   (2006.01)
  *C08G 77/38*   (2006.01)
  *C08G 77/388*   (2006.01)
  *C09D 183/08*   (2006.01)
  *C09D 183/10*   (2006.01)
  *C09K 11/08*   (2006.01)
  *C09K 11/56*   (2006.01)
  *C09K 11/70*   (2006.01)
  *G02F 1/1335*   (2006.01)
  *G02F 1/13357*   (2006.01)
  *H01L 27/32*   (2006.01)
  *H01L 51/52*   (2006.01)
  *H05B 33/22*   (2006.01)
  *H10K 50/86*   (2023.01)
  *H10K 59/38*   (2023.01)
  *B82Y 30/00*   (2011.01)
  *B82Y 40/00*   (2011.01)
  *H10K 59/80*   (2023.01)
  *H10K 102/00*   (2023.01)

(52) U.S. Cl.
  CPC ......... *C08G 77/388* (2013.01); *C09D 183/08* (2013.01); *C09D 183/10* (2013.01); *C09K 11/0883* (2013.01); *C09K 11/565* (2013.01); *C09K 11/70* (2013.01); *C09K 11/703* (2013.01); *G02F 1/133516* (2013.01); *G02F 1/133528* (2013.01); *G02F 1/133617* (2013.01); *H05B 33/22* (2013.01); *H10K 50/865* (2023.02); *H10K 59/38* (2023.02); *B32B 2457/20* (2013.01); *B32B 2457/202* (2013.01); *B32B 2457/206* (2013.01); *B82Y 30/00* (2013.01); *B82Y 40/00* (2013.01); *C09K 2323/00* (2020.08); *C09K 2323/03* (2020.08); *C09K 2323/031* (2020.08); *C09K 2323/033* (2020.08); *G02F 1/133565* (2021.01); *G02F 2201/52* (2013.01); *H10K 59/8792* (2023.02); *H10K 2102/331* (2023.02)

(56) References Cited

U.S. PATENT DOCUMENTS

| | | | |
|---|---|---|---|
| 9,196,682 B2 | 11/2015 | Jang et al. | |
| 9,199,842 B2 | 12/2015 | Dubrow et al. | |
| 9,274,372 B2 | 3/2016 | Park et al. | |
| 9,279,938 B2 | 3/2016 | Zhang | |
| 9,778,509 B2 | 10/2017 | Ishikawa | |
| 9,804,319 B2 | 10/2017 | Dubrow et al. | |
| 9,904,109 B2 | 2/2018 | Han et al. | |
| 9,995,958 B2 | 6/2018 | Park et al. | |
| 9,995,963 B2 | 6/2018 | Park et al. | |
| 10,048,530 B1 | 8/2018 | Kim et al. | |
| 10,090,367 B2 | 10/2018 | Choi et al. | |
| 10,114,247 B2 | 10/2018 | Lee | |
| 10,126,587 B2 | 11/2018 | Chung | |
| 10,126,598 B2 | 11/2018 | Han et al. | |
| 10,228,584 B2 | 3/2019 | Kim et al. | |
| 10,246,634 B2 | 4/2019 | Yang et al. | |
| 10,302,845 B2 | 5/2019 | Dubrow et al. | |
| 10,429,690 B2 | 10/2019 | Park et al. | |
| 10,444,423 B2 | 10/2019 | Dubrow et al. | |
| 10,551,553 B2 | 2/2020 | Dubrow et al. | |
| 10,559,726 B2 | 2/2020 | Kang et al. | |
| 10,585,228 B2 | 3/2020 | Kim et al. | |
| 10,899,105 B2 | 1/2021 | Dubrow et al. | |
| 10,983,386 B2 | 4/2021 | Park et al. | |
| 10,983,433 B2 | 4/2021 | Park et al. | |
| 11,046,885 B2 * | 6/2021 | Kim ...................... C08G 77/38 |
| 11,226,447 B2 | 1/2022 | Kim et al. | |
| 11,280,953 B2 | 3/2022 | Kim et al. | |
| 11,396,158 B2 | 7/2022 | Dubrow et al. | |
| 11,409,155 B2 | 8/2022 | Park et al. | |
| 2005/0275343 A1 | 12/2005 | Tanaka et al. | |
| 2006/0049745 A1* | 3/2006 | Handa .................. H10K 59/877 313/506 |
| 2009/0189516 A1 | 7/2009 | Kurata et al. | |
| 2010/0193806 A1 | 8/2010 | Byun | |
| 2012/0001217 A1 | 1/2012 | Kang et al. | |
| 2012/0113672 A1* | 5/2012 | Dubrow ............... G02B 6/0055 977/774 |
| 2013/0242228 A1* | 9/2013 | Park .................. G02F 1/133617 257/E33.012 |
| 2015/0205159 A1 | 7/2015 | Ito et al. | |
| 2015/0300600 A1 | 10/2015 | Dubrow et al. | |
| 2016/0186960 A1 | 6/2016 | Kim et al. | |
| 2016/0264820 A1 | 9/2016 | Kikuchi | |
| 2016/0274414 A1* | 9/2016 | Ishikawa ........... G02F 1/133609 |
| 2016/0349428 A1 | 12/2016 | Dubrow et al. | |
| 2016/0363713 A1 | 12/2016 | Dubrow et al. | |
| 2017/0031205 A1 | 2/2017 | Lee | |
| 2017/0052444 A1 | 2/2017 | Park et al. | |
| 2017/0082892 A1 | 3/2017 | Chung | |
| 2017/0082896 A1 | 3/2017 | Jang et al. | |
| 2017/0158954 A1 | 6/2017 | Yang et al. | |
| 2017/0183565 A1 | 6/2017 | Jun et al. | |
| 2017/0186922 A1 | 6/2017 | Kim et al. | |
| 2017/0317246 A1 | 11/2017 | Kang et al. | |
| 2017/0322451 A1 | 11/2017 | Kang et al. | |
| 2018/0105739 A1 | 4/2018 | Kim et al. | |
| 2018/0356574 A1* | 12/2018 | Li ..................... G02F 1/133617 |
| 2019/0113664 A1 | 4/2019 | Yoshikawa et al. | |
| 2019/0204673 A1 | 7/2019 | Kim et al. | |
| 2019/0391319 A1 | 12/2019 | Dubrow et al. | |
| 2020/0192016 A1 | 6/2020 | Kim et al. | |
| 2020/0208011 A1 | 7/2020 | Kikuchi et al. | |
| 2020/0249388 A1 | 8/2020 | Dubrow et al. | |
| 2021/0286259 A1 | 9/2021 | Park et al. | |
| 2021/0347146 A1 | 11/2021 | Dubrow et al. | |
| 2022/0137286 A1 | 5/2022 | Kim et al. | |

FOREIGN PATENT DOCUMENTS

| | | |
|---|---|---|
| CN | 105304684 A | 2/2016 |
| CN | 105739170 A | 7/2016 |
| CN | 106468856 A | 3/2017 |
| CN | 106468858 A | 3/2017 |
| CN | 106970505 A | 7/2017 |
| CN | 107092048 A | 8/2017 |
| CN | 107433746 A | 12/2017 |
| EP | 3136174 A1 | 3/2017 |
| EP | 3147708 A1 | 3/2017 |
| EP | 3239197 A1 | 11/2017 |
| JP | 2015102857 A | 6/2015 |
| JP | 2015138123 A | 7/2015 |
| JP | 2017068248 A | 4/2017 |
| JP | 2019028434 A | 2/2019 |
| KR | 20100088830 A | 8/2010 |
| KR | 20130104862 A | 9/2013 |
| KR | 20140127676 A | 11/2014 |
| KR | 20150033198 A | 4/2015 |
| KR | 20160109497 A | 9/2016 |
| KR | 101686715 B1 | 12/2016 |
| KR | 20160145168 A | 12/2016 |
| KR | 20170008171 A | 1/2017 |
| KR | 20170014755 A | 2/2017 |
| KR | 20170022951 A | 3/2017 |
| KR | 20170034055 A | 3/2017 |
| KR | 20170072418 A | 6/2017 |
| KR | 20170078553 A | 7/2017 |
| KR | 20180043748 A | 4/2018 |
| WO | WO2007055287 A1 | 11/2006 |

(56) References Cited

FOREIGN PATENT DOCUMENTS

| WO | 2015183300 A1 | 12/2015 |
| WO | WO2017159718 A1 | 9/2017 |
| WO | WO-2017164475 A1 * | 9/2017 |

OTHER PUBLICATIONS

Cheng Yanhua et al., "New quantum dots-converted light-emitting diodes with high color rendering index and high efficiency," CIESC Journal, 2017, pp. 247-253, vol. 68.

Megha Shrivastava et al., "Electrochemical synthesis of MoS2 quantum dots embedded nanostructured porous silicon with enhanced electroluminescence property," Optical Materials, Oct. 2, 2017, pp. 763-771, vol. 73.

Extended European Search Report dated May 21, 2019, of the corresponding European Patent Application No. 18213344.7.

Extract for Pigment Yellow 138 (Pigments, Organic, vol. 27, p. 419), (This textbook is a fair representation of the skilled persons common general knowledge.), Klaus Hunger et al., Jun. 15, 200.

Hermetric seal, Wikipedia, Jan. 10, 2021, p. 1, https://en.wikipedia.org/wiki/hermetic_seal.

Mesoporous silica, Wikipedia, Jan. 9, 2021, pp. 1-5, https://en.wikipedia.org/wiki/mesoporous_silica.

S.-H. Bang et al., "Permeation barrier properties of silicon oxide films deposited on polyethylene terephthalate (PET) substrate using roll-to-roll reactive magnetron sputtering system," Microelectronic Engineering, Sep. 15, 2016, pp. 39-44, vol. 166.

Yair Tamar et al., "Estimation of the porosity and refractive index of sol-gel silica films using high resolution electron microscopy," Solar Energy Materials & Solar Cells, 2014, pp. 246-256, vol. 130.

Office Action dated Nov. 27, 2023 of the corresponding Korean Patent Application No. 10-2018-0164319.

* cited by examiner a single layer of SiO$_x$ material(s)

SiO$_x$ – containing composites

SiO$_x$- based double layer

Repeating the Patterning Process three times

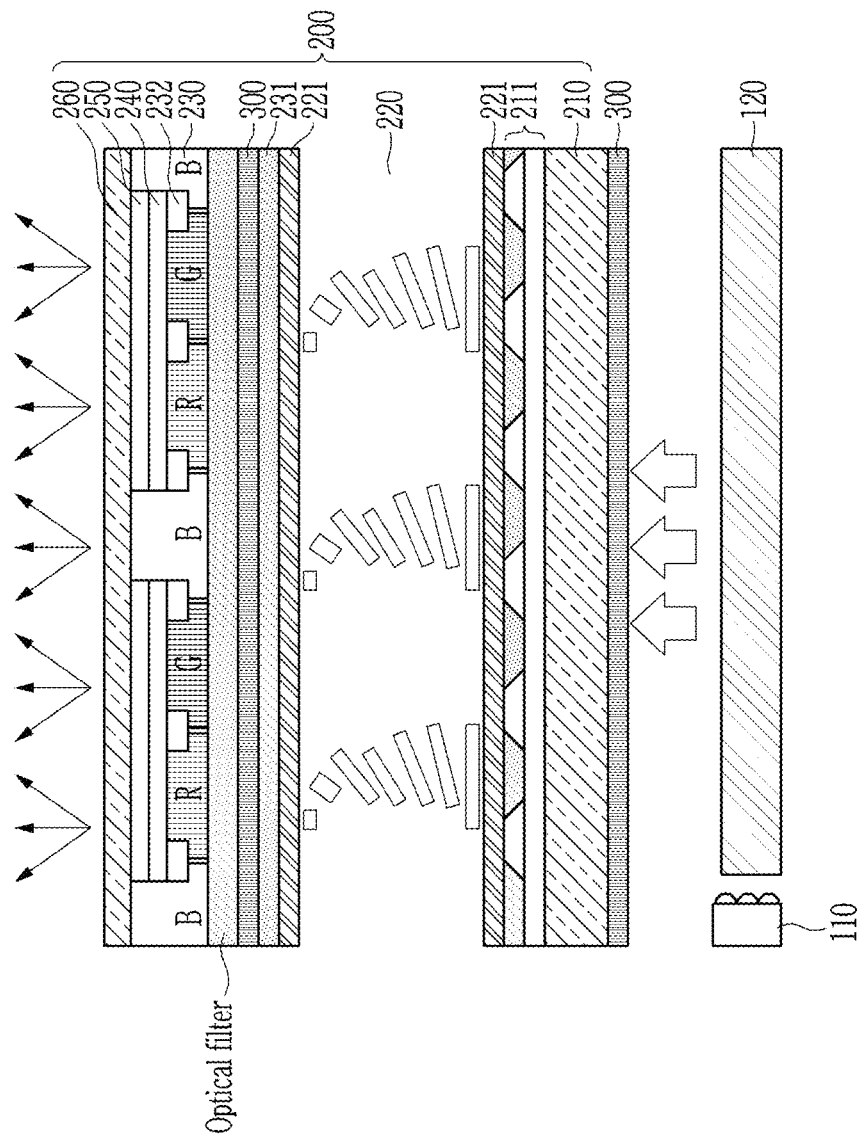

LAYERED STRUCTURES AND ELECTRONIC DEVICES INCLUDING THE SAME

CROSS-REFERENCE TO RELATED APPLICATION

This application is a continuation application of U.S. patent application Ser. No. 16/223,186, filed on Dec. 18, 2018, which claims priority to Korean Patent Application No. 10-2017-0174587 filed in the Korean Intellectual Property Office on Dec. 18, 2017, and all the benefits accruing therefrom under 35 U.S.C. § 119, the content of which is incorporated herein in its entirety by reference.

BACKGROUND

1. Field

Layered structures and electronic devices including the same are disclosed.

2. Description of the Related Art

Semiconductor nanocrystal particles also known as quantum dots are nano-sized crystalline material, e.g., having a diameter of less than or equal to about 10 nanometers (nm). Such semiconductor nanocrystal particles may have a large surface area per unit volume due to relatively small sizes and may exhibit characteristics different from bulk materials having the same composition due to a quantum confinement effect. Quantum dots may absorb light from an excitation source to be excited, and may emit energy corresponding to the energy bandgap of the quantum dots.

SUMMARY

An embodiment provides a layered structure capable of realizing improved luminous efficiency and color reproducibility.

An embodiment provides an electronic device including the layered structure.

An embodiment provides a display device (e.g., a liquid crystal display including the layered structure.

In an embodiment, a layered structure includes
a photoluminescent layer including a quantum dot polymer composite;
a light absorption layer disposed on the photoluminescent layer, the light absorption layer including an absorptive color-filter material; and
a silicon containing layer disposed between the photoluminescent layer and the light absorption layer,
wherein the quantum dot polymer composite includes a first polymer matrix and a plurality of quantum dots dispersed in the first polymer matrix, and the plurality of quantum dots are configured to absorb excitation light and emits light in a longer wavelength than the wavelength of the excitation light; and
the absorptive color-filter material is dispersed in a second polymer matrix, and the absorptive color-filter material is configured to absorb the excitation light that passes through the photoluminescent layer and to transmit the light emitted from the plurality of quantum dots.

The silicon containing layer may have a first surface contacting the photoluminescent layer and a second surface opposite to the first surface and the light absorption layer may be disposed directly on the second surface of the silicon containing layer.

The light absorption layer may have a first surface facing the photoluminescent layer and a second surface opposite to the first surface and the layered structure may further include a light transmitting substrate disposed on the second surface of the light absorption layer.

The quantum dot polymer composite may include at least one repeating section configured to emit light having a predetermined wavelength.

The repeating section may include a first section configured to emit a first light and a second section configured to emit a second light that is different from the first light.

The light absorption layer may be patterned to have a first absorption section and a second absorption section corresponding to the first section and the second section, respectively, and the first absorption section may be configured to transmit at least the first light and the second absorption section may be configured to transmit at least the second light.

The first polymer matrix may include a cross-linked polymer, a carboxylic acid group-containing binder polymer, or a combination thereof.

The cross-linked polymer may include a thiolene resin, a cross-linked poly(meth)acrylate, a cross-linked polyurethane, a cross-linked epoxy resin, a cross-linked vinyl polymer, a cross-linked silicone resin, or a combination thereof.

The carboxylic acid group-containing binder polymer may include
a linear copolymer of a monomer combination including a first monomer including a carboxylic acid group and a carbon-carbon double bond, a second monomer including a carbon-carbon double bond and a hydrophobic moiety and not including a carboxylic acid group, and optionally a third monomer including a carbon-carbon double bond and a hydrophilic moiety and not including a carboxylic acid group;
a multi-aromatic ring-containing polymer having a backbone structure in which two aromatic rings are bound to a quaternary carbon atom that is a constituent atom of another cyclic moiety in a main chain of the backbone structure, and including a carboxylic acid group (—COOH); or
a combination thereof.

The quantum dot may include a Group II-VI compound, a Group III-V compound, a Group IV-VI compound, a Group IV element or compound, a Group I-III-VI compound, a Group I-II-IV-VI compound, or a combination thereof.

The absorptive color-filter material may include an inorganic pigment, an inorganic dye, an organic pigment, an organic dye, or a combination thereof.

The second polymer matrix may include a (meth)acrylic polymer, a thiol-ene polymer, a polyurethane, an epoxy polymer, a vinyl polymer, a silicone polymer, an imide polymer, or a combination thereof.

The silicon containing layer may include $SiO_x$ wherein x is 1 to 2, an organosilicon compound including a moiety represented by *—Si—O—Si—* wherein * is a linking portion with an adjacent atom, or a combination thereof.

The silicon containing layer may include a deposition silica layer, a porous silica layer, a plurality of silica particles, or a combination thereof.

The silicon containing layer may include the deposition silica layer, the porous silica layer, or a combination thereof, and may further include a first layer comprising a crosslinked polymer, wherein the deposition silica layer, the porous silica layer, or a combination thereof may be disposed on the first layer comprising the cross-linked polymer; or the silicon containing layer may include a plurality of silica particles and may further include a cross-linked polymer, wherein the plurality of silica particles may be dispersed in the cross-linked polymer.

The silicon containing layer may include a first layer including a cross-linked polymer and an $SiO_x$ (x is 1 to 2) containing layer disposed on a surface of the first layer. The $SiO_x$ containing layer may include a deposition silica layer, a porous silica layer, or a combination thereof.

The organosilicon compound may include a silsesquioxane compound including a silsesquioxane structural unit represented by $(RSiO_{3/2})_n$ (wherein, n is an integer of 1 to 20 and R is hydrogen, a C1 to C30 substituted or unsubstituted aliphatic moiety, a C3 to C30 substituted or unsubstituted alicyclic moiety, a C6 to C30 substituted or unsubstituted aromatic moiety, or a combination thereof), and the silsesquioxane structural unit having a cage structure, a ladder structure, a polymeric structure, or a combination thereof. The organosilicon compound comprising the silsesquioxane structural unit may include a silsesquioxane compound comprising the silsesquioxane structural unit.

The organosilicon compound may include at least two silsesquioxane structural units linked by a linking group including a bond between sulfur and carbon.

The silicon containing layer may have a silicon content of greater than or equal to about 10 weight percent (wt %), based on a total weight thereof.

A thickness of the silicon containing layer may be greater than or equal to about 100 nm and less than or equal to 3 micrometers (μm).

The silicon containing layer may have a lower refractive index than the photoluminescent layer and the light absorption layer.

The layered structure may exhibit color reproducibility of greater than or equal to about 80%, based on Digital Cinema Initiatives (DCI) reference and conversion efficiency (CE) of greater than or equal to about 20%.

An embodiment provides an electronic device including the layered structure.

The electronic device may be a display device, an organic electroluminescent device, a micro LED device, a light emitting diode (LED) device, an image sensor, or an infrared (IR) sensor.

An embodiment provides a display device including the layered structure, wherein the display device includes
   a light source and a photoluminescent color filter layer disposed on the light source,
   wherein the photoluminescent color filter layer includes the layered structure, and
   the light source to supply incident light to the photoluminescent color filter layer.

The light source may include a plurality of light emitting units corresponding to the first section and the second section respectively and the light emitting unit may include a first electrode and a second electrode facing each other and an emission layer disposed between the first electrode and the second electrode.

The light source may further include a charge transport layer between the first electrode and the emission layer, between the second electrode and the emission layer, or both.

The display device may further include a lower substrate, an upper substrate, a polarizing plate disposed under the lower substrate, and a liquid crystal layer disposed between the upper and lower substrates, wherein the photoluminescent layer is disposed on the upper substrate and faces the liquid crystal layer, and the light source may be disposed under the polarizing plate.

The light source may include a light emitting element (e.g., LED) and optionally a light guide panel.

The display device may further include a polarizer between the lower substrate and the photoluminescent color filter layer.

The display device may exhibit color reproducibility of greater than or equal to about 80% based on DCI reference and conversion efficiency (CE) of greater than or equal to about 20%.

The layered structure according to an embodiment may contribute to realization of improved conversion efficiency and improved process stability.

BRIEF DESCRIPTION OF THE DRAWINGS

FIG. 6C is a schematic cross-sectional view of a display device (including a liquid crystal layer) according to an embodiment.

DETAILED DESCRIPTION

Figure 1:
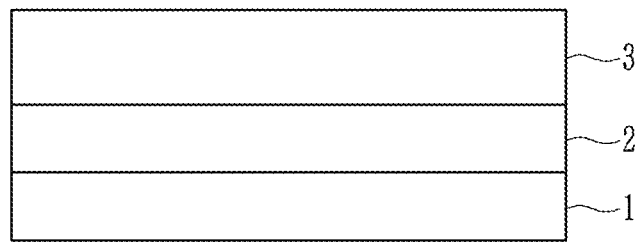
FIG. 1 is a schematic view of a cross-section of a layered structure according to an embodiment.

Advantages and characteristics of this disclosure, and a method for achieving the same, will become evident referring to the following example embodiments together with the drawings attached hereto. The embodiments, may, however, be embodied in many different forms and should not be construed as being limited to the embodiments set forth herein. If not defined otherwise, all terms (including technical and scientific terms) in the specification may be defined as commonly understood by one skilled in the art. The terms defined in a generally-used dictionary may not be interpreted ideally or exaggeratedly unless clearly defined. In addition, unless explicitly described to the contrary, the word "comprise" and variations such as "comprises" or "comprising" will be understood to imply the inclusion of stated elements but not the exclusion of any other elements.

Further, the singular includes the plural unless mentioned otherwise. As used herein, when a definition is not otherwise provided, the term "substituted" may refer to replacement of hydrogen of a compound or a group by a substituent of a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group (—NRR' wherein R and R' are independently hydrogen or a C1 to C6 alkyl group), an azido group (=N$_3$), an amidino group (—C(=NH)NH$_2$), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—C(=O) OR, wherein R is a C1 to C6 alkyl group or a C6 to C12 aryl group), a carboxyl group (—COOH) or a salt thereof (—C(=O)OM, wherein M is an organic or inorganic cation), sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), or a combination thereof.

As used herein, when a definition is not otherwise provided, the term "hetero" may refer to inclusion of at least one (e.g., 1 to 3) hetero atom of, N, O, S, Si, or P.

As used herein, "alkylene group" may refer to a straight or branched saturated aliphatic hydrocarbon group having a valence of at least two, optionally substituted with at least one substituent. As used herein, when a definition is not otherwise provided, "arylene group" may refer to a group having a valence of at least two obtained by removal of at least two hydrogens in at least one aromatic ring, optionally substituted with at least one substituent. As used herein, when a definition is not otherwise provided, "heteroarylene group" may include at least one substituent within a range not exceeding valence thereof and may refer to a group having a valence of at least two formed by removal of at least two hydrogen in at least one heteroaromatic ring or at least one aliphatic ring condensed with or connected to a heteroaromatic ring, the heteroaromatic ring including at least one (e.g., 1 to 3) heteroatom of N, O, S, Si, P, or a combination thereof.

In addition, "aliphatic hydrocarbon group" may refer to a C1 to C30 linear or branched alkyl group, a C2 to C30 linear or branched alkenyl group, or a C2 to C30 linear or branched alkynyl group, "aromatic hydrocarbon group" may refer to a C6 to C30 aryl group or a C2 to C30 heteroaryl group, and "alicyclic hydrocarbon group" may refer to a C3 to C30 cycloalkyl group, a C3 to C30 cycloalkenyl group, or a C3 to C30 cycloalkynyl group.

As used herein, "(meth)acrylate" refers to acrylate and/or methacrylate. The (meth)acrylate can be a (C1 to C10 alkyl) acrylate or a (C1 to C10 alkyl) methacrylate.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within +10% or 5% of the stated value.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, "hydrophobic moiety" refers to a moiety capable of providing the corresponding compound with a tendency to be agglomerated in an aqueous solution and to repel water. For example, the hydrophobic moiety may include an aliphatic hydrocarbon group having a carbon number of 2 or greater (alkyl, alkenyl, alkynyl, etc.), an aromatic hydrocarbon group having a carbon number of 6 or greater (phenyl, naphthyl, aralkyl group, etc.), or an alicyclic hydrocarbon group having a carbon number of 5 or greater (cyclohexyl, norbornenyl, norbornanyl, etc.).

As used herein, "visible light" may for example refer to light having a wavelength of about 400 nm to about 700 nm. As used herein, "ultraviolet" or "UV" may for example refer to light having a wavelength of greater than or equal to about 200 nm and less than about 400 nm.

As used herein, conversion efficiency (CE, %) refers to a ratio of emission light relative to incident light. For example, conversion efficiency is a ratio of a light emission dose of a quantum dot polymer composite relative to the light dose absorbed by the quantum dot polymer composite from excitation light (for example, blue light). The total light dose (B) of excitation light is obtained by integrating a photoluminescence (PL) spectrum of the excitation light. The PL spectrum of the quantum dot composite film is measured, a dose (A) of light in a green or red wavelength emitted from the quantum dot composite film and a dose (B') of excitation light that passes through the quantum dot composite film are obtained, respectively. The conversion efficiency is obtained by the following equation:

$$A/(B-B')\times 100 = \text{conversion efficiency (\%)}$$

Herein "dispersion" may refer to colloid-type dispersion wherein a dispersed phase has a dimension of about 1 nm to several micrometers (e.g., less than or equal to about 3 μm, less than or equal to about 2 μm, or less than or equal to about 1 μm).

As used herein, "Group" refers to a Group of Periodic Table.

"Group I" refers to a Group IA and a Group IB, and may include Li, Na, K, Rb, and Cs but are not limited thereto.

As used herein, "Group II" refers to Group IIA and a Group IIB, and examples of the Group II metal may include Cd, Zn, Hg, and Mg, but are not limited thereto.

"Group III" refers to a Group IIIA and a Group IIIB, and examples of the Group III metal may include Al, In, Ga, and TI, but are not limited thereto.

"Group IV" refers to a Group IVA and a Group IVB, and examples of the Group IV metal may include Si, Ge, and Sn, but are not limited thereto. As used herein, "metal" may include a semi-metal such as Si.

"Group V" refers to Group VA and may include nitrogen, phosphorus, arsenic, antimony, and bismuth but is not limited thereto.

"Group VI" refers to Group VIA and may include sulfur, selenium, and tellurium, but is not limited thereto.

As used herein, the term "silica" may refer to a silicon oxide such as "$SiO_x$ wherein x is 1 to 2"

Photoluminescence characteristics of quantum dots may be applied to various electronic devices such as display devices. In various electronic devices, replacing an absorptive color filter with a quantum dot-based color filter (e.g., a photoluminescent color filter) may be desired. Thus, development of a technology for improving photoluminescence properties of a quantum dot-based color filter may be desired.

In an embodiment, a layered structure includes a photoluminescent layer including a quantum dot polymer composite; a light absorption layer disposed on the photoluminescent layer and including an absorptive color-filter material; and a silicon containing layer disposed between the photoluminescent layer and the light absorption layer. Referring to FIG. 1, in an embodiment, a light absorption layer 3 is disposed on a photoluminescent layer 1 and a silicon containing layer 2 is disposed therebetween. The silicon containing layer 2 may have a first surface contacting the photoluminescent layer 1 and a second surface opposite to the first surface and the light absorption layer 3 may be disposed directly on the second surface of the silicon containing layer.

Figure 2:
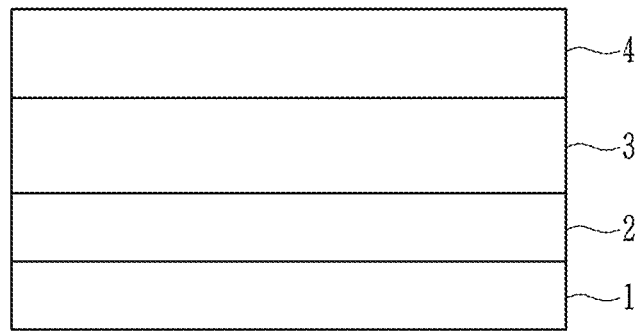
FIG. 2 is a schematic view of a cross-section of a layered structure according to an embodiment.

The light absorption layer may have a first surface facing the photoluminescent layer (e.g., facing or contacting the silicon containing layer) and a second surface opposite to the first surface. A light transmitting substrate may be disposed on (for example, directly on) the second surface of the light absorption layer. Referring to FIG. 2, the light absorption layer 3 is disposed on the photoluminescent layer 1, a silicon containing layer 2 is disposed therebetween, the first surface of the light absorption layer faces the photoluminescent layer, and a light transmitting substrate 4 is on the second surface opposed to the first surface of the light absorption layer.

The light transmitting substrate may be a substrate including an insulation material. The light transmitting substrate may be transparent for visible light. Herein, "transparent" refers to the case where a light transmittance for the corresponding light is greater than or equal to about 80%, for example, greater than or equal to about 85%, greater than or equal to about 90%, or greater than or equal to about 95%. The substrate may be silica-based glass; polyester such as polyethylene terephthalate (PET) and polyethylene naphthalate (PEN), various polymers such as polyimide, polyamide-imide, polycarbonate, and poly(meth)acrylate; an inorganic material such as $Al_2O_3$ or ZnO; or a combination thereof, but is not limited thereto. A thickness of the light transmitting substrate may be appropriately selected considering a substrate material but is not particularly limited. The light transmitting substrate may have flexibility. The substrate may be disposed on the second surface of the light absorption layer. The substrate may have a lower refractive index than the light absorption layer.

The quantum dot polymer composite included in the photoluminescent layer may include at least one repeating section configured to emit light having a predetermined wavelength. In an embodiment, the repeating section may include a first section (R) configured to emit a first light (e.g., red light) and a second section (G) configured to emit a second light (e.g., green light) that is different from the first light, and the light absorption layer may be patterned to have a first absorption section, a second absorption section, or both corresponding to the first section, the second section, or both. The first absorption section and the second absorption section may transmit at least the first light and at least the second light, respectively. For example, the first absorption section may transmit the first light (e.g., the red light) and block light having a wavelength outside the wavelength range of the first light (e.g., block the green light and/or blue light). The second absorption section may transmit the second light (e.g., the green light) and block light having a wavelength outside the wavelength range of the second light (e.g., block the red light and/or blue light).

Figure 3A:
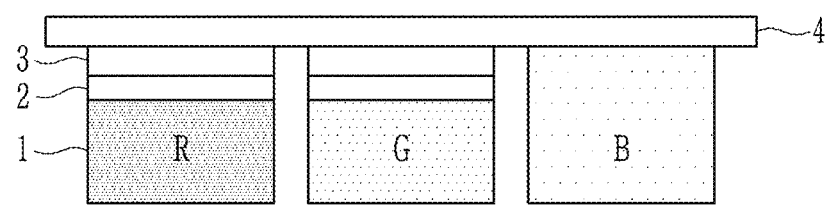
FIGS. 3A to 3B are schematic views of cross-sections of layered structures according to an embodiment including patterns.
Figure 3B:
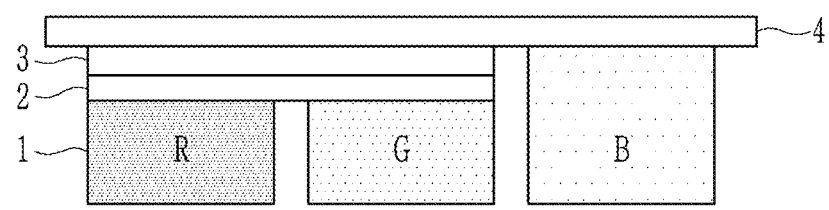

Referring to FIGS. 3A and 3B, the photoluminescent layer may include a red (R) section of a quantum dot polymer composite configured to emit red light and a green (G) section of a quantum dot polymer composite configured to emit green light, and the light absorption layer may be patterned to correspond to each of the R section and the G section or correspond to the R section and the G section together. The photoluminescent layer may include a blue (B) section of a quantum dot polymer composite configured to emit blue light. Alternatively, the photoluminescent layer may not include a quantum dot at a portion corresponding to the B section so as to transmit blue light (excitation light).

The first light may have a first peak wavelength (e.g., maximum photoluminescence peak wavelength) in a range of about 580 nm to about 650 nm (e.g., about 620 nm to about 650 nm). The first section may be the R section to emit red light. The second light may have a second peak wavelength in a range of about 480 nm to about 580 nm (e.g., about 500 nm to about 560 nm). The second section may be the G section to emit green light. The photoluminescent layer may include a third section to emit/pass third light. The third section may include a quantum dot or may not include a quantum dot. The third light may have a third peak wavelength in a range of about 380 nm to about 480 nm (e.g., about 440 nm to about 480 nm). The third light may be the excitation light but is not limited thereto.

The quantum dot may have a theoretical quantum yield (QY) of 100% and may emit light having high color purity (e.g., a full width at half maximum (FWHM) of less than or equal to about 40 nm). The quantum dot polymer composite or a pattern thereof, and a layered structure including the same may have potential utility as a color filter, for example a photoluminescent color filter in various electronic devices such as a liquid crystal display. A liquid crystal display device may include a backlight unit, a liquid crystal layer, and an absorptive color filter. In this device, white light emitted from the backlight unit passes through the liquid crystal layer and reaches the absorptive color filter, and then, light having a predetermined wavelength passes through a color filter (RGB) formed corresponding to each pixel, while the other light is absorbed therein and thus realizes a predetermined color in each pixel. The absorptive color filter may hardly avoid a substantial degradation of luminous efficiency in principle. In addition, as the light has linearity when the light passes liquid crystals, the LCD device has a limit in a viewing angle which it may realize.

However, in a display (e.g., liquid crystal display) device adopting a quantum dot-based photoluminescent color filter, an external light source (e.g., a backlight unit) emits excitation light (e.g., blue light or UV) capable of exciting a quantum dot instead of white light, a photoluminescent color filter including a quantum dot is disposed on a panel of the display device (e.g., over a liquid crystal layer or an upper substrate), and each pixel emits light of a predetermined wavelength.

Since a photoconversion by the quantum dot occurs in or over the upper part of the panel, light passing a liquid crystal layer and having linearity may proceed in all directions when the light passes through a color filter and thereby overcome a viewing angle related drawback from which an absorptive color filter-based display device may suffer. In addition, the quantum dot-based photoluminescent color filter may avoid a loss of light resulting from the absorptive color filter. In the display device including the quantum dot-based photoluminescent color filter, the converted light proceeds in the all directions, and an in-cell type polarizer (ICP) structure of disposing a polarizer between the color filter and the liquid crystal layer may be required. In case of the display device having a quantum dot-based color filter, excitation light not converted in the color filter and proceeding toward and being emitted from the front surface of the upper substrate may become a problem and accordingly, a color reproducibility of a device may sharply decrease and in some cases, it may not be possible to realize a desired color. Therefore, developing a technology of achieving a required level of color reproducibility for a display device including the quantum dot-based color filter may be desirable.

In order to handle this problem, a blue cut filter (BCF) may be adopted to prevent/suppress emission of excitation light (e.g., blue light). However, the blue cut filter typically includes a layered structure of layers made of materials having a different refractive index and thereby reflects blue light. Such a structure of the blue cut filter requires a process of stacking and patterning multi-layered high quality (i.e., defectless) inorganic thin film layers and thus may sharply increase a manufacturing cost of the device including the quantum dot-based color filter. In addition, the blue cut filter having a multi-layer structure may increase a reflection of external light and thus seriously deteriorate a contrast of the display device and thus may result in a decrease in clarity or contrast ratio of the display device.

The layered structures according to an embodiment have the aforementioned structure and thereby may solve these problems. In the layered structure according to an embodiment, a light absorption layer including an absorptive color-filter material is disposed on a photoluminescent layer including a quantum dot polymer composite and a silicon containing layer is disposed between the photoluminescent layer and the light absorption layer. The absorptive color-filter material dispersed in a second polymer matrix is configured to absorb non-converted excitation light that passes through the photoluminescent layer and to transmit the light emitted from the plurality of quantum dots. Through such a structure, the layered structure according to an embodiment may achieve improved color purity and contrast simultaneously and may also achieve technical effects (e.g., improved luminous efficiency and wide viewing angle) of quantum dot-based color filter.

The quantum dot polymer composite included in the photoluminescent layer includes a first polymer matrix and the plurality of quantum dots dispersed in the first polymer matrix. The plurality of quantum dots are configured to absorb excitation light (e.g., blue light having a maximum photoluminescence peak wavelength of about 430 nm to about 470 nm or green light having a maximum photoluminescence peak wavelength of about 510 nm to about 550 nm) and to emit light (e.g., the first light and the second light) in a longer wavelength than the excitation light (that is, lower energy than that of the excitation light).

The first polymer matrix may include a cross-linked polymer, a carboxylic acid group-containing binder polymer, or a combination thereof. The cross-linked polymer may be a polymer cross-linked by light.

The cross-linked polymer may include a thiol-ene resin, a cross-linked poly(meth)acrylate, a cross-linked polyurethane, a cross-linked epoxy resin, a cross-linked vinyl polymer, a cross-linked silicone resin, or a combination thereof. The cross-linked polymer may be a copolymer.

The cross-linked polymer may be a polymerization product of a combination including a photopolymerizable compound (e.g., a monomer or an oligomer) having one or more, for example, two, three, four, five, six, or more photopolymerizable functional groups (e.g., carbon-carbon double bonds such as (meth)acrylate groups or vinyl groups, epoxy groups, etc.). The photopolymerizable compound may be a photopolymerizable monomer or oligomer that may be used in a photosensitive resin composition.

In an embodiment, the photopolymerizable compound may include an ethylenic unsaturated monomer such as a (meth)acrylate monomer or a vinyl monomer; a reactive oligomer having two or more photopolymerizable moieties (e.g., epoxy groups, vinyl groups, etc.) (e.g., oligomer of a vinyl compound, an ethylene oligomer, alkylene oxide oligomer, etc.); a copolymer of the reactive oligomer and the ethylenic unsaturated monomer, a urethane oligomer having two or more photopolymerizable moieties (e.g., (meth) acrylate moieties); a siloxane oligomer having two or more photopolymerizable moieties; or a combination thereof. The photopolymerizable compound may further include a thiol compound having at least two thiol groups at both terminal ends. The photopolymerizable compound may be commercially available or may be synthesized. The cross-linked polymer may be a polymerization product of a mixture including the photopolymerizable compound.

The (meth)acrylate monomer may include a monofunctional or multi-functional ester of (meth)acrylic acid having at least one carbon-carbon double bond. The (meth)acrylate monomer may include a di(meth)acrylate compound, a tri(meth)acrylate compound, a tetra(meth)acrylate compound, a penta(meth)acrylate compound, a hexa(meth)acrylate compound, or a combination thereof. Examples of the acrylate monomer may be an alkyl (meth)acrylate, ethylene glycol di(meth)acrylate, triethylene glycol di(meth)acrylate, diethylene glycol di(meth)acrylate, 1,4-butanediol di(meth) acrylate, 1,6-hexanediol di(meth)acrylate, neopentylglycol di(meth)acrylate, pentaerythritol di(meth)acrylate, pentaerythritol tri(meth)acrylate, pentaerythritol tetra(meth) acrylate, dipentaerythritol di(meth)acrylate, dipentaerythritol tri(meth)acrylate, dipentaerythritol penta(meth)acrylate, dipentaerythritol hexa(meth)acrylate, bisphenol A epoxy (meth)acrylate, bisphenol A di(meth)acrylate, trimethylolpropane tri(meth)acrylate, novolac epoxy (meth)acrylate, ethylglycolmonomethylether (meth)acrylate, tris(meth) acryloyloxyethyl phosphate, dipropylene glycol di(meth) acrylate, tripropylene glycol di(meth)acrylate, or propylene glycol di(meth)acrylate, but are not limited thereto.

The multi-thiol compound having at least two thiol groups at both terminal ends may be a compound represented by Chemical Formula 1:

Chemical Formula 1

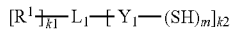

wherein,

R$^1$ is hydrogen; a substituted or unsubstituted C1 to C30 linear or branched alkyl group; a substituted or unsubstituted C6 to C30 aryl group; a substituted or unsubstituted C7 to C30 arylalkyl group; a substituted or unsubstituted C3 to C30 heteroaryl group; a substituted or unsubstituted C3 to C30 heteroarylalkyl group; a substituted or unsubstituted C3 to C30 cycloalkyl group; a substituted or unsubstituted C2 to C30 heterocycloalkyl group; C1 to C10 alkoxy group; hydroxy group; —NH$_2$; a substituted or unsubstituted C1 to C30 amine group (—NRR', wherein R and R' are independently hydrogen or C1 to C30 linear or branched alkyl group, but simultaneously not hydrogen); an isocyanate group; a halogen; —ROR' (wherein R is a substituted or unsubstituted C1 to C20 alkylene group and R' is hydrogen or a C1 to C20 linear or branched alkyl group); an acyl halide (—RC(=O) X, wherein R is a substituted or unsubstituted alkylene group and X is a halogen); —C(=O) OR' (wherein R' is hydrogen or a C1 to C20 linear or branched alkyl group); —CN; —C(=O) NRR'(wherein R and R' are independently hydrogen or a C1 to C20 linear or branched alkyl group); —C(=O)ONRR' (wherein R and R' are independently hydrogen or a C1 to C20 linear or branched alkyl group); or a combination thereof, L$_1$ is a carbon atom, a substituted or unsubstituted C1 to C30 alkylene group, a substituted or unsubstituted C2 to C30 alkylene group wherein at least one methylene (—CH$_2$—) is replaced by sulfonyl (—SO$_2$—), carbonyl (CO), ether (—O—), sulfide(—S—), sulfoxide (—SO—), ester (—C(=O)O—), amide (—C(=O) NR—) (wherein R is hydrogen or a C1 to C10 alkyl group), or a combination thereof, a substituted or unsubstituted C3 to C30 cycloalkylene group, a substituted or unsubstituted C6 to C30 arylene group, a substituted or unsubstituted C3 to C30 heteroarylene group, or a substituted or unsubstituted C3 to C30 heterocycloalkylene group, Y$_1$ is a single bond; a substituted or unsubstituted C1 to C30 alkylene group; a substituted or unsubstituted C2 to C30 alkenylene group; or a substituted or unsubstituted C2 to C30 alkylene group or a substituted or unsubstituted C3 to C30 alkenylene group wherein at least one methylene (—CH$_2$—) is replace by sulfonyl (—S(=O)$_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 linear or branched alkyl group), imine (—NR—) (wherein R is hydrogen or a C1 to C10 linear or branched alkyl group), or combination thereof, m is an integer of 1 or more, k1 is 0 or an integer of 1 or more, k2 is an integer of 1 or more, and the sum of m and k2 is an integer of 3 or more, provided that when Y$_1$ is not a single bond, m does not exceed the valence of Y$_1$ and provided that the sum of k1 and k2 does not exceed the valence of L$_1$.

The multi-thiol compound may include a compound represented by Chemical Formula 1-1:

Chemical Formula 1-1

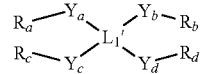

Herein, L$_1$' is carbon; a substituted or unsubstituted C2 to C20 alkylene group; a substituted or unsubstituted C6 to C30 arylene group; a substituted or unsubstituted C3 to C30 heteroarylene group; a substituted or unsubstituted C3 to C30 cycloalkylene group; or a substituted or unsubstituted C3 to C30 heterocycloalkylene group, Y$_a$ to Y$_d$ are independently a single bond; a substituted or unsubstituted C1 to C30 alkylene group; a substituted or unsubstituted C2 to C30 alkenylene group; or a substituted or unsubstituted C2 to C30 alkylene group or a substituted or unsubstituted C3 to C30 alkenylene group wherein at least one methylene (—CH$_2$—) is replaced by sulfonyl (—S(=O)$_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 linear or branched alkyl group), imine (—NR—) (wherein R is hydrogen or a C1 to C10 linear or branched alkyl group) or a combination thereof, and R$^a$ to R$_d$ are independently R$^1$ of Chemical Formula 1 or SH, provided that at least two of R$^a$ to R$_d$ are SH.

The multi-thiol compound may be a dithiol compound, a trithiol compound, a tetrathiol compound, or a combination thereof. The multi-thiol compound may include ethoxylated pentaerythritol tetra (3-mercaptopropionate), trimethylolpropane tri(3-mercaptopropionate), trimethylolpropane tri (2-mercaptoacetate), glycol di-3-mercaptopropionate (e.g., C2-C10 alkylene glycol di-3-mercaptopropionate, such as ethylene glycol di-3-mercaptopropionate), polypropylene glycol di(3-mercaptopropionate), ethoxylated trimethylpropane tri(3-mercaptopropionate), glycol dimercaptoacetate (e.g., C2-C10 alkylene glycol dimercaptoacetate, such as ethylene glycol dimercaptoacetate), ethoxylated glycol dimercaptoacetate (e.g., ethoxylated C2-C10 alkylene glycol di-3-mercaptopropionate, such as ethoxylated ethylene glycol di-3-mercaptopropionate), 1,4-bis(3-mercaptobutyryloxy)butane, trimethylolpropane tris(3-mercaptopropionate), tris[2-(3-mercaptopropinonyloxy)ethyl]isocyanurate, 1,3,5-tris(3-mercaptobutyloxyethyl)-1,3,5-triazine-2,4,6(1H,3H,5H)-trione, pentaerythritol tetrakis(3-mercaptopropionate), pentaerythritol tetrakis(2-mercaptoacetate), 1,6-hexanedithiol; 1,3-propanedithiol, 1,2-ethanedithiol, polyethylene glycol dithiol including 1 to 10 ethylene glycol repeating units, or a combination thereof. A reaction between the thiol compound and the ethylenic unsaturated monomer may provide a thiol-ene resin.

The carboxylic acid group-containing binder polymer may include
a linear copolymer of a monomer combination including a first monomer including a carboxylic acid group and a carbon-carbon double bond, a second monomer including a carbon-carbon double bond and a hydrophobic moiety and not including a carboxylic acid group, and optionally a third monomer including a carbon-carbon double bond and a hydrophilic moiety and not including a carboxylic acid group;
a multi-aromatic ring-containing polymer having a backbone structure in which two aromatic rings are bound to a quaternary carbon atom that is a constituent atom of another cyclic moiety in the main chain of the backbone structure, and including a carboxylic acid group (—COOH); or
a combination thereof.

Examples of the first monomer may include carboxylic acid vinyl ester compounds such as acrylic acid, methacrylic acid, maleic acid, itaconic acid, fumaric acid, 3-butenoic acid, vinyl acetate, or vinyl benzoate, but are not limited thereto. The first monomer may be at least one compound, e.g., two or more different compounds.

Examples of the second monomer may be an alkenyl aromatic compound such as styrene, alpha-methyl styrene, vinyl toluene, or vinyl benzyl methyl ether; a unsaturated carboxylic acid ester compound such as methyl acrylate, methyl methacrylate, ethyl acrylate, ethyl methacrylate, butyl acrylate, butyl methacrylate, benzyl acrylate, benzyl methacrylate, cyclohexyl acrylate, cyclohexyl methacrylate, phenyl acrylate, or phenyl methacrylate; unsaturated carboxylic acid amino alkyl ester compound such as 2-amino ethyl acrylate, 2-amino ethyl methacrylate, 2-dimethyl amino ethyl acrylate, or 2-dimethyl amino ethyl methacrylate; maleimides such as N-phenylmaleimide, N-benzylmaleimide, N-alkylmaleimide; a unsaturated carboxylic acid glycidyl ester compound such as glycidyl acrylate or glycidyl methacrylate; a vinyl cyanide compound such as acrylonitrile, methacrylonitrile; or a unsaturated amide compound such as acryl amide or methacryl amide, but are not limited thereto. As the second monomer, at least one compound, e.g., two or more different compounds, may be used.

Examples of the third monomer may include 2-hydroxy ethyl acrylate, 2-hydroxy ethyl methacrylate, 2-hydroxy butyl acrylate, or 2-hydroxy butyl methacrylate, but are not limited thereto. As the third monomer, at least one compound, e.g., two or more different compounds, may be used.

The copolymer (also referred to as the carboxylic acid group-containing polymer) may include a first repeating unit derived from the first monomer, a second repeating unit derived from the second monomer, and optionally a third repeating unit derived from the third monomer. In the copolymer, a content of the first repeating unit may be greater than or equal to about 10 mole percent (mol %), for example, greater than or equal to about 15 mol %, greater than or equal to about 25 mol %, or greater than or equal to about 35 mol %. In the carboxylic acid group containing polymer, a content of the first repeating unit may be less than or equal to about 90 mol %, for example, less than or equal to about 89 mol %, less than or equal to about 80 mol %, less than or equal to about 70 mol %, less than or equal to about 60 mol %, less than or equal to about 50 mol %, less than or equal to about 40 mol %, less than or equal to about 35 mol %, or less than or equal to about 25 mol %.

In the copolymer, a content of the second repeating unit may be greater than or equal to about 10 mol %, for example, greater than or equal to about 15 mol %, greater than or equal to about 25 mol %, or greater than or equal to about 35 mol %. In the copolymer, a content of the second repeating unit may be less than or equal to about 90 mol %, for example, less than or equal to about 89 mol %, less than or equal to about 80 mol %, less than or equal to about 70 mol %, less than or equal to about 60 mol %, less than or equal to about 50 mol %, less than or equal to about 40 mol %, less than or equal to about 35 mol %, or less than or equal to about 25 mol %.

In the carboxylic acid group-containing binder polymer, if present, a content of the third repeating unit may be greater than or equal to about 1 mol %, for example, greater than or equal to about 5 mol %, greater than or equal to about 10 mol %, or greater than or equal to about 15 mol %. In the binder polymer, a content of the third a repeating unit may be less than or equal to about 30 mol %, for example, less than or equal to about 25 mol %, less than or equal to about 20 mol %, less than or equal to about 18 mol %, less than or equal to about 15 mol %, or less than or equal to about 10 mol %.

The copolymer may be a copolymer of (meth)acrylic acid and at least one second/third monomer of aryl or alkyl (meth)acrylate, hydroxyalkyl (meth)acrylate, or styrene. For example, the binder polymer may be a (meth)acrylic acid/methyl (meth)acrylate copolymer, a (meth)acrylic acid/benzyl (meth)acrylate copolymer, a (meth)acrylic acid/benzyl (meth)acrylate/styrene copolymer, a (meth)acrylic acid/benzyl (meth)acrylate/2-hydroxy ethyl (meth)acrylate copolymer, a (meth)acrylic acid/benzyl (meth)acrylate/styrene/2-hydroxy ethyl (meth)acrylate copolymer, or a combination thereof.

The carboxylic acid group-containing binder polymer may include a multi-aromatic ring-containing polymer. The multi-aromatic ring-containing polymer has a backbone structure in which two aromatic rings are bound to a quaternary carbon atom that is a constituent atom of another cyclic moiety in the main chain of the backbone structure, (e.g., being bound to the main chain) and includes a carboxylic acid group (—COOH).

In the multi-aromatic ring-containing polymer, the backbone structure may include a unit represented by Chemical Formula A:

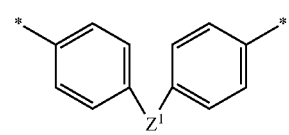

Chemical Formula A wherein, * is a linking portion with an adjacent atom of the main chain of the binder, and $Z_1$ is a linking moiety represented by any one of Chemical Formulae A-1 to A-6, and in Chemical Formulae A-1 to A-6, * is a linking portion with an aromatic moiety:

Chemical Formula A-1

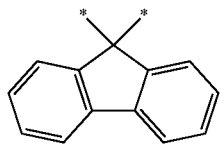

Chemical Formula A-2

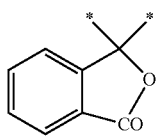

Chemical Formula A-3

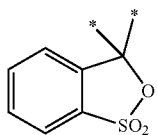

Chemical Formula A-4

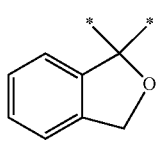

Chemical Formula A-5

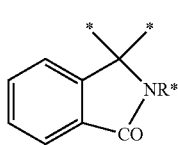

Chemical Formula A-6

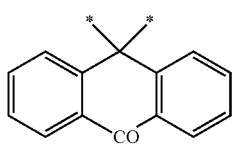

wherein, $R^a$ is a hydrogen, an ethyl group, C2H4Cl, C2H4OH, CH2CH=CH2, or a phenyl group.

The multi-aromatic ring-containing polymer may include a structural unit represented by Chemical Formula B:

Chemical Formula B

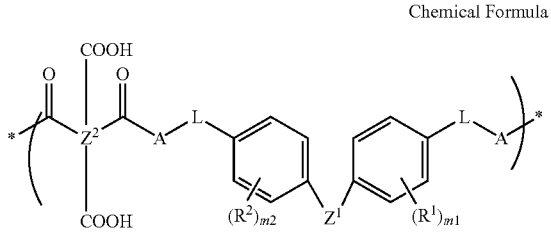

wherein $Z^1$ is a linking moiety represented by any one of Chemical Formulae A-1 to A-6, each L is the same or different and each is independently a single bond, a C1 to C10 alkylene, a C1 to C10 alkylene having a substituent including a carbon-carbon double bond, a C1 to C10 oxy alkylene, or a C1 to C10 oxy alkylene having a substituent including a carbon-carbon double bond, $R^1$ and $R^2$ are independently a hydrogen atom, a halogen atom, or a substituted or unsubstituted C1 to C20 alkyl group, m1 and m2 are independently an integer ranging from 0 to 4, each A is the same or different and each is independently —NH—, —O—, a C1 to C10 alkylene, or a combination thereof, and $Z^2$ is a C6 to C40 aromatic hydrocarbon group.

In Chemical Formula B, $Z^2$ may be any one of Chemical Formula B-1, Chemical Formula B-2 and Chemical Formula B-3:

Chemical Formula B-1

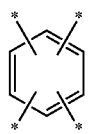

wherein * is a linking portion with an adjacent carbonyl carbon,

Chemical Formula B-2

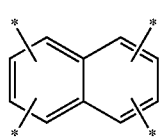

wherein * is a linking portion with carbonyl carbon,

Chemical Formula B-3

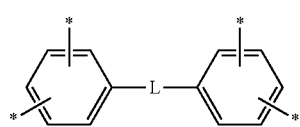

wherein * is a linking portion with an adjacent carbonyl carbon, L is a single bond, —O—, —S—, —C(=O)—, —CH(OH)—, —S(=O)2—, —Si(CH3)2—, (CH2)$_p$ (wherein 1≤p≤10), (CF2)$_q$ (wherein 1≤q≤10), —CR2— (wherein R is independently hydrogen, a C1 to C10 aliphatic hydrocarbon group, a C6 to C20 aromatic hydrocarbon group, or a C6 to C20 alicyclic hydrocarbon group), —C(CF3)2—, —C(CF3)(C6H5)—, or —C(=O)NH—.

The multi-aromatic ring-containing polymer may include a structural unit represented by Chemical Formula C:

Chemical Formula C

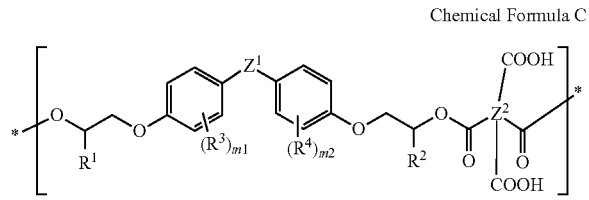

wherein each of $R^1$ and $R^2$ is independently hydrogen or a substituted or unsubstituted (meth)acryloyloxyalkyl group, $R^3$ and $R^4$ are independently hydrogen, a halogen, or a substituted or unsubstituted C1 to C20 alkyl group, $Z^1$ is a linking moiety represented by Chemical Formulae A-1 to A-6, $Z^2$ is an aromatic hydrocarbon group such as the moieties represented by any one of Chemical Formula B-1, Chemical Formula B-2 and Chemical Formula B-3 above, and m1 and m2 are independently an integer ranging from 0 to 4, and

* is a linking portion with an adjacent atom.

In an embodiment, the multi-aromatic ring-containing polymer may be an acid adduct of bisphenol fluorene epoxy acrylate. For example, the bisphenol fluorene epoxy acrylate may be prepared by reacting 4,4-(9-fluorenylidene)-diphenol and epichlorohydrin to obtain an epoxy compound having a fluorene moiety, and the epoxy compound is reacted with an acrylic acid to obtain a fluorenyl epoxy acrylate, which is then further reacted with biphenyldianhydride and/or phthalic anhydride or tetrahydrophthalic anhydride. The Reaction Scheme may be summarized as below:

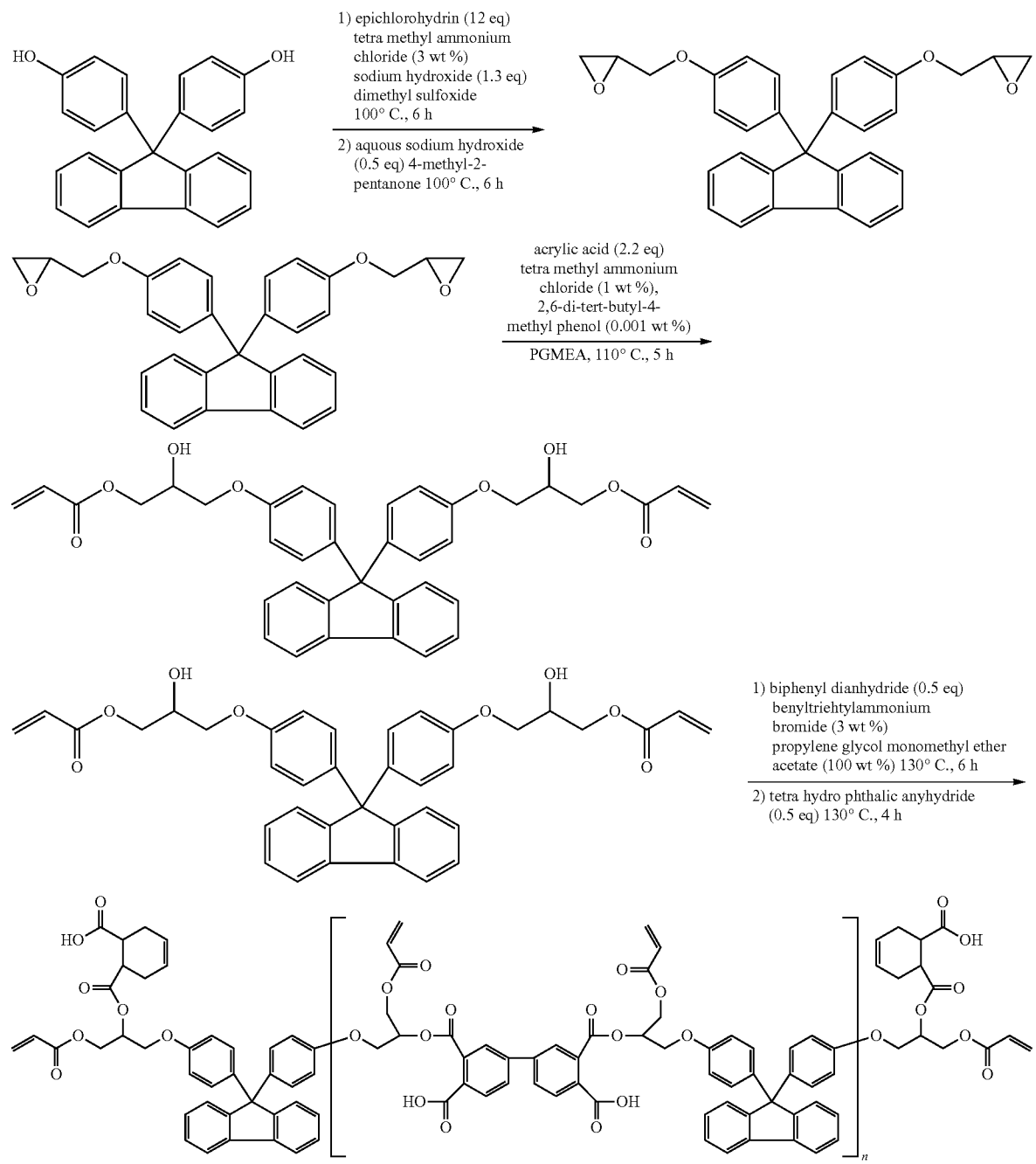

The multi-aromatic ring-containing polymer may include a functional group represented by Chemical Formula D at one or both terminal ends:

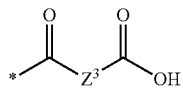

Chemical Formula D wherein, in Chemical Formula D, $Z^3$ is a moiety represented by one of Chemical Formulae D-1 to D-7, and * is a linking portion with an adjacent atom:

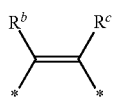

Chemical Formula D-1 wherein, $R^b$ and $R^c$ are independently a hydrogen atom, a substituted or unsubstituted C1 to C20 alkyl group, or a substituted or unsubstituted C2 to C20 alkyl group in which at least one methylene is replaced by an ester group, an ether group, or a combination thereof;

Chemical Formula D-2

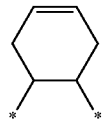

Chemical Formula D-3

Chemical Formula D-4

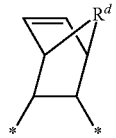

Chemical Formula D-5

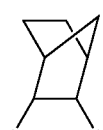

Chemical Formula D-6

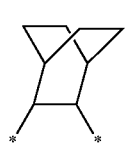

Chemical Formula D-7 wherein, $R^d$ is O, S, NH, a substituted or unsubstituted C1 to C20 alkylene group, a C1 to C20 alkylamine group, or a C2 to C20 alkenylamine group.

The multi-aromatic ring-containing polymer may be synthesized or commercially available (e.g., from Nippon Steel Chemical Co., Ltd.).

The multi-aromatic ring-containing polymer may include a moiety derived from a reaction product of a fluorene compound of 9,9-bis(4-hydroxyphenyl)fluorene, 9,9-bis(4-aminophenyl)fluorene, 9,9-bis[4-(glycidyloxy)phenyl]fluorene, or 9,9-bis[4-(2-hydroxyethoxy)phenyl]fluorene with an appropriate compound capable of reacting with the fluorene compound (e.g., an aromatic dianhydride of 9,9-bis-(3,4-dicarboxyphenyl)fluorene dianhydride, pyromellitic dianhydride (PMDA), biphenyltetracarboxylic dianhydride (BPDA), benzophenone tetracarboxylic dianhydride, or naphthalene tetracarboxylic dianhydride, a C2 to C30 diol compound, epichlorohydrine, or the like).

The fluorene compound, dianhydride, diol compound, and the like are commercially available, and the reaction conditions therebetween may be readily discerned by one of skill in the art.

An acid value of the carboxylic acid group-containing polymer (binder) may be greater than or equal to about 50 milligrams of potassium hydroxide (KOH) per gram (mg KOH/g). For example, the carboxylic acid group-containing polymer have an acid value of greater than or equal to about 60 mg KOH/g, greater than or equal to about 70 mg KOH/g, greater than or equal to about 80 mg KOH/g, greater than or equal to about 90 mg KOH/g, greater than or equal to about 100 mg KOH/g, greater than or equal to about 110 mg KOH/g, greater than or equal to about 120 mg KOH/g, greater than or equal to about 125 mg KOH/g, or greater than or equal to about 130 mg KOH/g. The acid value of the polymer may be for example less than or equal to about 250 mg KOH/g, less than or equal to about 240 mg KOH/g, less than or equal to about 230 mg KOH/g, less than or equal to about 220 mg KOH/g, less than or equal to about 210 mg KOH/g, less than or equal to about 200 mg KOH/g, less than or equal to about 190 mg KOH/g, less than or equal to about 180 mg KOH/g, or less than or equal to about 160 mg KOH/g, but is not limited thereto.

The quantum dot (hereinafter, referred to as a semiconductor nanocrystal) disposed (e.g., dispersed) in the first polymer matrix is not particularly limited and may be commercially available. For example, the quantum dot may include a Group II-VI compound, a Group III-V compound, a Group IV-VI compound, a Group IV element or compound, a Group I-III-VI compound, a Group I-II-IV-VI compound, or a combination thereof. The quantum dot may not include cadmium, lead, or a combination thereof.

The Group II-VI compound may be a binary element compound of CdSe, CdTe, ZnS, ZnSe, ZnTe, ZnO, HgS, HgSe, HgTe, MgSe, MgS, or a combination thereof; a ternary element compound of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, or a combination thereof; or a quaternary element compound of ZnSeSTe, HgZnTeS, CdZnSeS, CdZnSeTe, CdZnSTe, CdHgSeS, CdHgSeTe, CdHgSTe, HgZnSeS, HgZnSeTe, HgZnSTe, or a combination thereof. The Group II-VI compound may further include Group III metal.

The Group III-V compound may be a binary element compound of GaN, GaP, GaAs, GaSb, AlN, AlP, AlAs, AlSb, InN, InP, InAs, InSb, or a combination thereof; a ternary element compound of GaNP, GaNAs, GaNSb, GaPAs, GaPSb, AlNP, AlNAs, AlNSb, AlPAs, AlPSb, InNP, InNAs, InNSb, InPAs, InPSb, or a combination thereof; or a quaternary element compound of GaAlNP, GaAlNAs, GaAl- NSb, GaAlPAs, GaAlPSb, GaInNP, GaInNAs, GaInNSb, GaInPAs, GaInPSb, InAlNP, InAlNAs, InAlNSb, InAlPAs, InAlPSb, or a combination thereof. The Group III-V compound may further include a Group II metal (e.g., InZnP) The Group IV-VI compound may be a binary element compound of SnS, SnSe, SnTe, PbS, PbSe, PbTe, or a combination thereof; a ternary element compound of SnSeS, SnSeTe, SnSTe, PbSeS, PbSeTe, PbSTe, SnPbS, SnPbSe, SnPbTe, or a combination thereof; or a quaternary element compound of SnPbSSe, SnPbSeTe, SnPbSTe, or a combination thereof.

Examples of the Group I-III-VI compound may include $CuInSe_2$, $CuInS_2$, CuInGaSe, and CuInGaS, but are not limited thereto. Examples of the Group I-II-IV-VI compound may include CuZnSnSe and CuZnSnS, but are not limited thereto.

The Group IV element or compound may include an elementary substance selected from Si, Ge, or a combination thereof; or a binary element compound selected from SiC, SiGe, or a combination thereof.

The binary element compound, the ternary element compound, or the quaternary element compound respectively exist in a uniform concentration in the particle or partially different concentrations in the same particle. The semiconductor nanocrystal may have a core/shell structure wherein a second semiconductor nanocrystal having a different composition from a first semiconductor nanocrystal is disposed on a core including the first semiconductor nanocrystal. An alloy interlayer may or may not exist on the interface between the core and the shell. When the alloy interlayer is present, the interface between the core and the shell may have a concentration gradient wherein a concentration of an element of the shell is changed in a radial direction (e.g., increased or decreased toward the core). The shell may include a multi-layered shell having at least two layers. In the multi-layered shell, each layer may have a single composition or a composition having an alloy or a concentration gradient, but is not limited thereto.

In the core-shell semiconductor nanocrystal, the shell may have a larger energy bandgap than the core or vice versa. In the multi-layered shell, an outer shell of a core may have a greater energy bandgap than a shell near to a core, but is not limited thereto.

The quantum dot may have a size (e.g., a particle diameter or in the case of non-spherically shaped particle, a diameter calculated from a two-dimensional area confirmed by an electron microscopy analysis) of about 1 nm to about 100 nm. In an embodiment, the quantum dot may have a particle size (the longest dimension for a non-spherically shaped particle) of about 1 nm to about 20 nm, for example, 2 nm (or 3 nm) to 15 nm. In an embodiment, the quantum dot may have a particle diameter of greater than or equal to about 2 nm, greater than or equal to about 3 nm, greater than or equal to about 4 nm, or greater than or equal to about 5 nm. The quantum dot may have a particle size of less than or equal to about 50 nm, less than or equal to about 45 nm, less than or equal to about 40 nm, less than or equal to about 35 nm, less than or equal to about 30 nm, less than or equal to about 25 nm, less than or equal to about 20 nm, less than or equal to about 15 nm, less than or equal to about 10 nm, less than or equal to about 9 nm, less than or equal to about 8 nm, or less than or equal to about 7 nm.

In addition, a shape of the quantum dot is not particularly limited. For example, the quantum dot may include a spherical, oval, pyramidal, multi-armed, or cube nanoparticle, nanotube, nanowire, nanofiber, nanosheet, or a combination thereof.

In addition, the quantum dot may be commercially available or may be synthesized in a suitable method. For example, a nano-sized quantum dot, e.g., having a diameter of less than or equal to about 10 nm, may be synthesized by a wet chemical process. In the wet chemical process, precursor materials react in an organic solvent to grow crystal particles and the organic solvent or a ligand compound may naturally coordinate to the surface of the quantum dot, controlling the growth of the crystal. Examples of the organic solvent and the ligand compound may be readily discerned by one of skill in the art. The organic solvent coordinated on, e.g., bound to, the surface of the quantum dot may affect stability of a device, and thus excess organic materials that are not coordinated on the surface of the nanocrystals may be removed by pouring a reacted solution in excess non-solvent, and centrifuging the resulting mixture. Examples of the non-solvent may be acetone, ethanol, methanol, and the like, but are not limited thereto.

The quantum dot may have an organic ligand bound to a surface of the quantum dot. The organic ligand may have a hydrophobic moiety. In an embodiment, the organic ligand may include RCOOH, $RNH_2$, $R_2NH$, $R_3N$, RSH, $R_3PO$, $R_3P$, ROH, RCOOR', $RPO(OH)_2$, RHPOOH, $R_2POOH$ (wherein, R and R' are independently a substituted or unsubstituted C5 to C24 aliphatic hydrocarbon group, for example, a substituted or unsubstituted alkyl or alkenyl, or a substituted or unsubstituted C6 to C20 aromatic hydrocarbon group, for example, an aryl group), a polymer organic ligand, or a combination thereof.

Examples of the organic ligand may include thiol compounds such as methane thiol, ethane thiol, propane thiol, butane thiol, pentane thiol, hexane thiol, octane thiol, dodecane thiol, hexadecane thiol, octadecane thiol, or benzyl thiol; amines such as methane amine, ethane amine, propane amine, butane amine, pentyl amine, hexyl amine, octyl amine, nonylamine, decylamine, dodecyl amine, hexadecyl amine, octadecyl amine, dimethyl amine, diethyl amine, dipropyl amine, tributylamine, or trioctylamine; carboxylic acid compounds such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid; phosphine compounds such as methyl phosphine, ethyl phosphine, propyl phosphine, butyl phosphine, pentyl phosphine, octylphosphine, dioctyl phosphine, tributylphosphine, trioctylphosphine diphenyl phosphine, triphenyl phosphine; phosphine oxide compounds such as methyl phosphine oxide, ethyl phosphine oxide, propyl phosphine oxide, butyl phosphine oxide, pentyl phosphine oxide, tributyl phosphine oxide, octylphosphine oxide, dioctyl phosphine oxide, or trioctyl phosphine oxide; diphenyl phosphine oxide, or triphenyl phosphine oxide; a C5 to C20 alkyl phosphonic; a C5 to C20 alkyl phosphinic acid such as hexylphosphinic acid, octylphosphinic acid, dodecanephosphinic acid, tetradecanephosphinic acid, hexadecanephosphinic acid, or octadecanephosphinic acid; and the like, but are not limited thereto. The quantum dot may include one or more organic ligand(s).

The quantum dot may have quantum efficiency of greater than or equal to about 10%, for example, greater than or equal to about 30%, greater than or equal to about 50%, greater than or equal to about 60%, greater than or equal to about 70%, greater than or equal to about 90% or even about 100%. The quantum dot may have a narrower photoluminescence spectrum. For example, the quantum dot may have a full width at half maximum (FWHM) of less than or equal to about 45 nm, for example less than or equal to about 40 nm, less than or equal to about 30 nm in a photoluminescence wavelength spectrum.

The quantum dot may emit light in wavelength ranges of ultraviolet (UV) to visible ray or even near infrared ray or more by changing sizes and compositions. For example, the quantum dot may emit light in a wavelength of about 300 nm to about 700 nm, for example, about 400 nm to about 700 nm or light in a wavelength of about 700 nm or greater, but is not limited thereto. For example, the quantum dot may absorb the third light (e.g., blue light) (e.g., excited by the third light) and may emit the first light or the second light.

The quantum dot polymer composite may further include a metal oxide particulate as desired. The metal oxide particulate may include titanium oxide, silicon oxide, barium oxide, zinc oxide, or a combination thereof. The metal oxide particulate may include $TiO_2$, $SiO_2$, $BaTiO_3$, $Ba_2TiO_4$, $ZnO$, $ZrO_2$, or a combination thereof. The metal oxide particulate may have an average particle size of greater than or equal to about 100 nm and less than or equal to about 500 nm, but is not limited thereto. The metal oxide particulate may perform a function of light diffusion/scattering.

In the quantum dot polymer composite, an amount of the quantum dot is not particularly limited, but may be appropriately controlled. The amount of the quantum dot may be greater than or equal to about 1 wt %, for example, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, greater than or equal to about 10 wt %, greater than or equal to about 11 wt %, greater than or equal to about 12 wt %, greater than or equal to about 13 wt %, greater than or equal to about 14 wt %, greater than or equal to about 15 wt %, greater than or equal to about 16 wt %, greater than or equal to about 17 wt %, greater than or equal to about 18 wt %, greater than or equal to about 19 wt %, greater than or equal to about 20 wt %, greater than or equal to about 21 wt %, greater than or equal to about 22 wt %, greater than or equal to about 23 wt %, greater than or equal to about 24 wt %, greater than or equal to about 25 wt %, greater than or equal to about 26 wt %, greater than or equal to about 27 wt %, greater than or equal to about 28 wt %, greater than or equal to about 29 wt %, or greater than or equal to about 30 wt %, based on a total weight of the composite. The amount of the quantum dot may be less than or equal to about 70 wt %, for example, less than or equal to about 65 wt %, less than or equal to about 60 wt %, less than or equal to about 55 wt %, less than or equal to about 50 wt %, less than or equal to about 45 wt %, less than or equal to about 40 wt %, less than or equal to about 35 wt %, less than or equal to about 30 wt %, less than or equal to about 25 wt %, less than or equal to about 20 wt %, less than or equal to about 19 wt %, less than or equal to about 17 wt %, or less than or equal to about 15 wt %, based on a total weight of the composite.

In the quantum dot polymer composite, if present, an amount of the metal oxide particulate may be greater than or equal to about 0.1 wt %, greater than or equal to about 0.5 wt %, greater than or equal to about 1 wt %, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, or greater than or equal to about 9 wt %, based on a total weight of the composite. The amount of the metal oxide particulate may be less than or equal to about 50 wt %, less than or equal to about 40 wt %, less than or equal to about 30 wt %, less than or equal to about 25 wt %, less than or equal to about 20 wt %, less than or equal to about 19 wt %, less than or equal to about 18 wt %, less than or equal to about 17 wt %, less than or equal to about 16 wt %, or less than or equal to about 15 wt %, based on a total weight of the composite.

In the layered structure, a thickness of the photoluminescent layer may be appropriately selected. For example, the thickness of the photoluminescent layer may be greater than or equal to about 2 micrometers (μm), greater than or equal to about 3 μm, greater than or equal to about 4 μm and for example less than or equal to about 12 μm, less than or equal to about 10 μm, less than or equal to about 9 μm, less than or equal to about 8 μm, less than or equal to about 7 μm, or less than or equal to about 6 μm.

In the light absorption layer disposed on the photoluminescent layer and including an absorptive color-filter material, the absorptive color-filter material is dispersed in a second polymer matrix. The absorptive color-filter material is configured to absorb the excitation light that passes through the photoluminescent layer and to transmit the light emitted from the plurality of quantum dots. Unlike a blue cut filter including a multi-layered inorganic film, the light absorption layer arranged in the structure of the embodiment may accomplish improved color purity without causing relatively substantial deterioration in a contrast of a display device.

In an embodiment, the light absorption layer is configured to absorb excitation light and to transmit light emitted from quantum dots (e.g., first light and/or second light). When the photoluminescent layer has a repeating section (e.g., including the first and the second sections), the light absorption layer may be patterned to have a first absorption section and a second absorption section corresponding to the first section and the second section, respectively, and the first absorption section may be configured to absorb excitation light and to transmit at least the first light and the second absorption section may be configured to absorb excitation light and to transmit at least the second light. In an embodiment, when the excitation light is blue light (having a center wavelength of about 430 nm to about 470 nm), the absorptive color-filter material may be a yellow color-filter material that absorbs the blue light and transmits light of about 470 nm to about 650 nm (e.g., green light having a center wavelength of about 510 nm to about 550 nm and red light having a center wavelength of about 570 nm to about 640). The absorptive color-filter material may be a green color filter material that absorbs blue light and red light and transmits green light. The absorptive color-filter material may be a red color filter material that absorbs blue light and green light and transmits red light.

The absorptive color-filter material may include an organic pigment, an organic dye, an inorganic pigment, an inorganic dye, or a combination thereof.

The organic/inorganic pigment/dye (hereinafter, also referred to as a colorant) for the absorptive color-filter material is not particularly limited and may be appropriately selected considering wavelength ranges of a blocked light and transmitted light. Examples of the organic pigment may be Pigment Red 122, Pigment Red 202, Pigment Red 206, Pigment Red 209, Pigment Red 177, Pigment Red 254 classified by color indices published by "The (C.I.) Society of Dyers and Colourists Co."; Pigment Yellow 13, Pigment Yellow 55, Pigment Yellow 119, Pigment Yellow 138, Pigment Yellow 139, Pigment Yellow 168; materials having color indices of Pigment Green 7 or Pigment Green 36 or a derivative thereof. Examples of the inorganic pigment may include titanium oxide, barium sulfate, calcium carbonate, zinc oxide, lead lactate, yellow lead, zinc sulfide, iron oxide red, cadmium red, ultramarine blue, Prussian blue, chromium oxide green, cobalt green, amber, and the like, but are not limited thereto. For example, examples of red (R) colorant may include a perylene-based pigment, a lake pigment, an azo-based pigment, a quinacridone-based pigment, an anthraquinone-based pigment, an anthracene-based pigment, an isoindoline-based pigment, an isoindolinone-based pigment, or a combination thereof, but are not limited thereto. Examples of the green (G) colorant may be a halogen multi-substituted phthalocyanine-based pigment, a halogen multi-substituted copper phthalocyanine-based pigment, a triphenylmethane-based basic dye, an isoindoline-based pigment, an isoindolinone-based pigment, or a combination thereof, but are not limited thereto.

The second polymer matrix may include a (meth)acrylate polymer, a thiol-ene polymer, a urethane polymer, an epoxy polymer, a vinyl polymer, a silicone polymer, an imide polymer, an amide polymer, or a combination thereof (e.g., copolymers or mixtures of the polymers, etc.). The second polymer matrix may include a cross-linked polymer. The cross-linked polymer is the same as in the first polymer matrix.

In the light absorption layer, an amount of the absorptive color-filter material may be controlled appropriately. For example, the amount of the absorptive color-filter material may be greater than or equal to about 10 wt %, greater than or equal to about 15 wt %, greater than or equal to about 20 wt %, greater than or equal to about 25 wt %, greater than or equal to about 30 wt %, greater than or equal to about 35 wt %, or greater than or equal to about 40 wt %, based on a total weight of the light absorption layer. The amount of the absorptive color-filter material may be less than or equal to about 90 wt %, less than or equal to about 85 wt %, less than or equal to about 80 wt %, less than or equal to about 75 wt %, less than or equal to about 70 wt %, less than or equal to about 65 wt %, less than or equal to about 60 wt %, or less than or equal to about 55 wt %, based on a total weight of the light absorption layer.

In the light absorption layer, an amount of the second polymer matrix may be appropriately controlled. For example, the amount of the second polymer matrix may be greater than or equal to about 10 wt %, greater than or equal to about 15 wt %, greater than or equal to about 20 wt %, greater than or equal to about 25 wt %, greater than or equal to about 30 wt %, greater than or equal to about 35 wt %, or greater than or equal to about 40 wt %, based on a total weight of the light absorption layer. The amount of the second polymer matrix may be less than or equal to about 90 wt %, less than or equal to about 85 wt %, less than or equal to about 80 wt %, less than or equal to about 75 wt %, less than or equal to about 70 wt %, less than or equal to about 65 wt %, less than or equal to about 60 wt %, or less than or equal to about or 55 wt %, based on a total weight of the light absorption layer.

A thickness of the light absorption layer may be appropriately selected considering an absorbance of excitation light (e.g., blue light). For example, the thickness of the light absorption layer may be greater than or equal to about 0.1 μm, greater than or equal to about 0.2 μm, greater than or equal to about 0.3 μm, greater than or equal to about 0.4 μm, or greater than or equal to about 0.5 μm. The thickness of the light absorption layer may be less than or equal to about 3 μm, less than or equal to about 2.5 μm, less than or equal to about 2 μm, or less than or equal to about 1.5 μm.

The aforementioned light absorption layer may allow a layered structure according to an embodiment to accomplish improved color purity as well as maintain a satisfactory contrast, but the light absorption layer may also bring about a relatively substantial loss of excitation light and may be a cause of deterioration of a photoluminescent layer.

When the photoluminescent layer is disposed directly on a light transmitting substrate (e.g., glass) without the light absorption layer, at least a portion of non-converted excitation light emitted toward the light transmitting substrate may suffer an internal total reflection (ITR) on the interface between the photoluminescent layer and the light transmitting substrate and between the light transmitting substrate and the air. This internal total reflection may optically recirculate excitation light and increase conversion efficiency. However, when the light absorption layer is disposed on the photoluminescent layer, the internal total reflection of non-converted excitation light does not almost occur despite disposition of the light transmitting substrate on the light absorption layer, and thus a light conversion rate may sharply decrease.

In addition, the present inventors have discovered that the light absorption layer may be a cause of substantial chemical/thermal degradation of the photoluminescent layer. A patterning process of the photoluminescent layer on the light absorption layer may accompany a heat treatment at a relatively high temperature. The materials (e.g., a component of a quantum dot polymer composite and a component of organic/inorganic dyes) may move/diffuse in the interface between the light absorption layer and the photoluminescent layer during the heat treatment, and thereby, chemical/thermal degradation of a quantum dot polymer composite may be noticeable. The degradation (lower stability) of a quantum dot polymer composite may lead to a sharp decrease in luminous efficiency of the photoluminescent layer. Accordingly, a layered structure having the photoluminescent layer and the light absorption layer may show greatly decreased luminous efficiency. For example, the luminous efficiency of the layered structure having the photoluminescent layer and the light absorption layer may be less than or equal to about 77% of that of a structure having no light absorption layer.

The layered structure according to an embodiment includes a silicon containing layer between the photoluminescent layer and the light absorption layer. The layered structure according to an embodiment may realize improved luminous efficiency along with improved color reproducibility. Without being bound by any theory, interposition of the silicon containing layer may cause the internal reflection or internal total reflection of non-converted excitation light on the interface between the photoluminescent layer and the silicon containing layer. This internal reflection or total reflection may contribute to an optical recirculation. In addition, a silicon containing layer disposed between the photoluminescent layer and the light absorption layer may block a material movement between the photoluminescent layer and the light absorption layer during the heat treatment and contribute to suppressing/reducing/preventing the degradation of the photoluminescent layer.

The silicon containing layer may not include the quantum dot and the absorptive color-filter material. The silicon containing layer may include silicon oxide. The silicon containing layer may consist of silicon oxide. The silicon oxide may include $SiO_x$ (wherein x is 1 to 2), an organo-silicon compound including a moiety represented by *—Si—O—Si—* (wherein * is a linking portion with an adjacent atom), or a combination thereof. The silicon containing layer may include a deposition silica layer, a porous silica layer, an organosilicon compound layer, a plurality of silica particles, or a combination thereof. The silicon containing layer may include a cross-linked polymer and a plurality of silica particles dispersed in the cross-linked polymer. The silicon containing layer may include a first layer including a cross-linked polymer and a $SiO_x$ (wherein x is a number of 1 to 2) containing layer disposed on, e.g., directly contacts, a surface of the first layer. The $SiO_x$ containing layer may include a deposition silica layer, a porous silica layer, or a combination thereof.

The organosilicon compound may have an *—Si—O—Si—* bond and tetrahedral Si vertices. The organosilicon compound may include a silsesquioxane (SSQ) structural unit that is represented by $(RSiO_{3/2})_n$ (wherein, n is 1 to 20 and R is hydrogen, a C1 to C30 substituted or unsubstituted aliphatic moiety, a C3 to C30 substituted or unsubstituted alicyclic moiety, a C6 to C30 substituted or unsubstituted aromatic moiety, or a combination thereof) and may have a cage structure, a ladder structure, a polymeric structure, or a combination thereof.

The Si containing layer (e.g., SSQ containing layer) may chemically block the photoluminescent layer and the light absorption layer therebetween while having a lower refractive index than the light absorption layer. For example, silsesquioxane may have a porous structure having a silicon oxide-based micropore and may realize a low refractive index than that of a cross-linked polymer. Accordingly, the internal total reflection suppressed by the light absorption layer may occur between the photoluminescent layer and the Si-containing layer and thus increase a recirculation ratio of excited light, which may be confirmed by improved luminous efficiency of the layered structure before a heat treatment at a high temperature. In addition, the above Si-containing layer may suppress degradation of the layered structure on the interface between the light absorption layer and the photoluminescent layer during the heat treatment at a high temperature, which may be confirmed by a process maintenance rate after the heat treatment at a high temperature. Accordingly, the layered structure according to an embodiment may show increased luminous efficiency as well as improved color reproducibility and a high contrast ratio.

In an embodiment, the organosilicon compound may include at least two silsesquioxane structural units linked by a linking group including a bond between sulfur and carbon.

The linking group may be formed by a reaction between a silsesquioxane compound including at least two thiol groups at the terminal end (hereinafter, thiol-substituted silsesquioxane compound) and an-ene compound having a carbon-carbon unsaturated bond (e.g., double bond or triple bond) (e.g., at least one, or at least two carbon-carbon unsaturated bond at a terminal end thereof).

In an embodiment, the thiol-substituted silsesquioxane compound may be $(RSiO_{3/2})_n$ (wherein, R is hydrogen, —SH, a C1 to C40 substituted or unsubstituted aliphatic hydrocarbon group, a C6 to C40 substituted or unsubstituted aromatic hydrocarbon group, a C3 to C40 substituted or unsubstituted alicyclic hydrocarbon group, or a combination thereof, provided that at least two of R's are —SH and n is 6, 8, 10, or 12).

In an embodiment, the thiol-substituted silsesquioxane compound may have the following chemical structure:

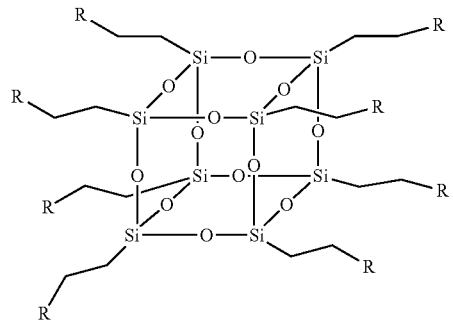

wherein, R is hydrogen, —SH, a C1 to C40 substituted or unsubstituted aliphatic hydrocarbon group, a C6 to C40 substituted or unsubstituted aromatic hydrocarbon group, a C3 to C40 substituted or unsubstituted alicyclic hydrocarbon group, or a combination thereof, provided that at least two (e.g., 3, 4, 5, 6, 7, or 8) of R's are —SH.

The -ene compound having the carbon-carbon unsaturated bond may be represented by Chemical Formula 2:

Chemical Formula 2

wherein, X is a C2-30 aliphatic hydrocarbon group having a carbon-carbon unsaturated bond (e.g., double bond or triple bond), a C6-30 aromatic hydrocarbon group having a carbon-carbon unsaturated bond, or a C3-30 alicyclic hydrocarbon group having a carbon-carbon unsaturated bond, $R^2$ is hydrogen; a substituted or unsubstituted C1 to C30 linear or branched alkyl group; a substituted or unsubstituted C6 to C30 aryl group; a substituted or unsubstituted C3 to C30 heteroaryl group; a substituted or unsubstituted C3 to C30 cycloalkyl group; a substituted or unsubstituted C3 to C30 heterocycloalkyl group; a C1 to C10 alkoxy group; a hydroxy group; $NH_2$; a substituted or unsubstituted C1 to C30 amine group (—NRR', wherein R and R' are independently hydrogen or a C1 to C30 linear or branched alkyl group); an isocyanate group; a halogen; —ROR' (wherein R is a substituted or unsubstituted C1 to C20 alkylene group R' is hydrogen or a C1 to C20 linear or branched alkyl group); an acyl halide (—RC(=O)X, wherein R is a substituted or unsubstituted C1 to C20 alkylene group and X is a halogen); —C(=O)OR' (wherein R' is hydrogen or a C1 to C20 linear or branched alkyl group); —CN; —C(=O)ONRR' (wherein R and R' are independently hydrogen or a C1 to C20 linear or branched alkyl group); or a combination thereof, $L_2$ is a carbon atom, a substituted or unsubstituted C1 to C30 alkylene group, a substituted or unsubstituted C2 to C30 alkylene group wherein at least one methylene (—$CH_2$—) is replaced by sulfonyl (—$SO_2$—), carbonyl (CO), ether (—O—), sulfide (—S—), sulfoxide (—SO—), ester (—C(=O)O—), amide (—C(=O)NR—) (wherein R is hydrogen or a C1 to C10 alkyl group) or a combination thereof, a substituted or unsubstituted C6 to C30 cycloalkylene group, a substituted or unsubstituted C6 to C30 arylene group, or a substituted or unsubstituted C3 to C30 heteroarylene group, a substituted or unsubstituted C6 to C30 heterocycloalkylene group, or a combination thereof, $Y_2$ is a single bond; a substituted or unsubstituted C1 to C30 alkylene group; a substituted or unsubstituted C2 to C30 alkenylene group; or a substituted or unsubstituted C2 to C30 alkylene group or a substituted or unsubstituted C3 to C30 alkenylene group wherein at least one methylene (—CH$_2$—) is replaced by sulfonyl (—S(=O)$_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 linear or branched alkyl group), imine (—NR—) (wherein R is hydrogen or a C1 to C10 linear or branched alkyl group) or a combination thereof, n is an integer of 1 or more, k3 is 0 or an integer of greater than or equal to one (1), k4 is an integer of 1 or more, and the sum of n and k4 is an integer of 3 or more, n may not exceed the valence of $Y_2$ when $Y_2$ is not a single bond provided that the sum of k3 and k4 does not exceed the valence of $L_2$.

The -ene compound having the carbon-carbon unsaturated may be a compound represented by Chemical Formula 2-1, Chemical Formula 2-2, or Chemical Formula 2-3:

Chemical Formula 2-1

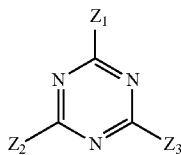

Chemical Formula 2-2

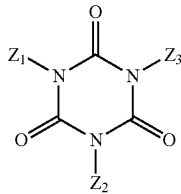

wherein, in Chemical Formulae 2-1 and 2-2, $Z_1$ to $Z_3$ are the same or different and are independently *—$Y_2$—(X)$_n$ of Chemical Formula 2;

Chemical Formula 2-3

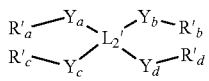

wherein, $L_2'$ is carbon; a substituted or unsubstituted C1 to C30 alkylene group; a substituted or unsubstituted C2 to C30 alkenylene group; a substituted or unsubstituted C2 to C30 alkylene group wherein at least one methylene (—CH$_2$—) is replaced by sulfonyl (—S(=O)$_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 linear or branched alkyl group), imine (—NR—) (wherein R is hydrogen or a C1 to C10 linear or branched alkyl group), a C6 to C10 cycloalkylene group, or a combination thereof; a substituted or unsubstituted C3 to C30 alkenylene group wherein at least one methylene (—CH$_2$—) is replaced by sulfonyl (—S(=O)$_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 linear or branched alkyl group), imine (—NR—) (wherein R is hydrogen or a C1 to C10 linear or branched alkyl group), a C6 to C10 cycloalkylene group, or a combination thereof; a substituted or unsubstituted C6 to C30 arylene group; a substituted or unsubstituted C3 to C30 heteroarylene group; a substituted or unsubstituted C3 to C30 cycloalkylene group; or a substituted or unsubstituted C3 to C30 heterocycloalkylene group, $Y_a$ to $Y_d$ are independently a single bond; a substituted or unsubstituted C1 to C30 alkylene group; a substituted or unsubstituted C2 to C30 alkenylene group; or a substituted or unsubstituted C2 to C30 alkylene group or a substituted or unsubstituted C3 to C30 alkenylene group wherein at least one methylene (—CH$_2$—) is replaced by sulfonyl (—S(=O)$_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 linear or branched alkyl group), imine (—NR—) (wherein R is hydrogen or a C1 to C10 linear or branched alkyl group), or a combination thereof, and $R'_a$ to $R'_d$ are $R^2$ or X of Chemical Formula 2, provided that at least two of R' a to R' d are X of Chemical Formula 2.

The -ene compound having the carbon-carbon unsaturated may include a compound of Chemical Formula 2-4, a compound of Chemical Formula 2-5, a compound of Chemical Formula 2-6, a compound of Chemical Formula 2-7, a compound of Chemical Formula 2-8, a compound of Chemical Formula 2-9, a compound of Chemical Formula 2-10, a compound of Chemical Formula 2-11, a compound of Chemical Formula 2-12, a compound of Chemical Formula 2-13, a compound of Chemical Formula 2-14, a compound of Chemical Formula 2-15, a compound of Chemical Formula 2-16, or a mixture thereof:

Chemical Formula 2-4

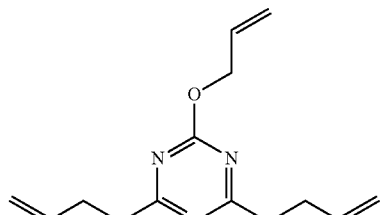

Chemical Formula 2-5

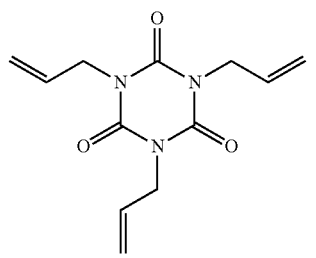

Chemical Formula 2-6

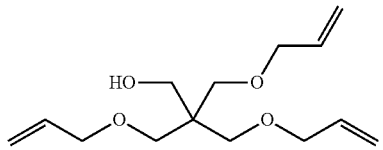

Chemical Formula 2-7

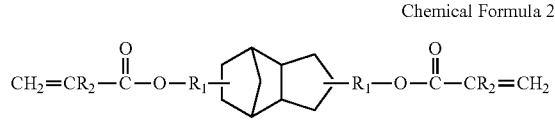

wherein, in Chemical Formula 2-7, $R_1$ is a single bond, a C1 to C20 alkylene group, or a C2 to C20 alkylene group wherein at least one methylene (—$CH_2$—) is replaced by sulfonyl (—S(=O)$_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 linear or branched alkyl group), imine (—NR—) (wherein R is hydrogen or a C1 to C10 linear or branched alkyl group), or a combination thereof, and $R_2$ is hydrogen or a methyl group;

Chemical Formula 2-8

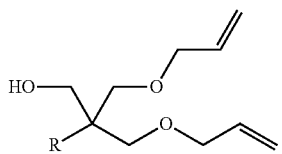

wherein, in Chemical Formula 2-8, R is hydrogen or a C1 to C10 alkyl group;

Chemical Formula 2-9

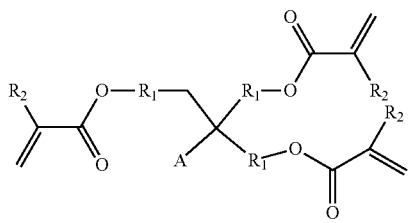

wherein, in Chemical Formula 2-9, A is hydrogen, a C1 to C10 alkyl group, or a hydroxy group, $R_1$ is a single bond, a C1 to C20 alkylene group, a C2 to C20 alkylene wherein at least one methylene (—$CH_2$—) is replaced by sulfonyl (—S(=O)$_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 linear or branched alkyl group), imine (—NR—) (wherein R is hydrogen or a C1 to C10 linear or branched alkyl group), or a combination thereof, and $R_2$ is hydrogen or a methyl group;

Chemical Formula 2-10

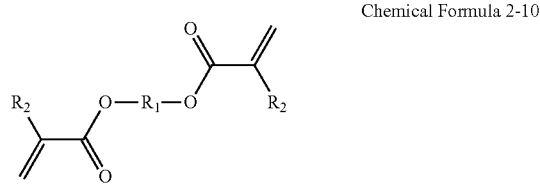

wherein, in Chemical Formula 2-10, $R_1$ is a single bond, a C1 to C20 alkylene, or a C2 to C20 alkylene wherein at least one methylene (—$CH_2$—) is replaced by sulfonyl (—S(=O)$_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 linear or branched alkyl group), imine (—NR—) (wherein R is hydrogen or a C1 to C10 linear or branched alkyl group), or a combination thereof, and $R_2$ is hydrogen or a methyl group;

Chemical Formula 2-11

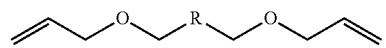

wherein, in Chemical Formula 2-11, R is a single bond, a C1 to C20 alkylene, or a C2 to C20 alkylene wherein at least one methylene (—$CH_2$—) is replaced by sulfonyl (—S(=O)$_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 linear or branched alkyl group), imine (—NR—) (wherein R is hydrogen or a C1 to C10 linear or branched alkyl group), or a combination thereof, Chemical Formula 2-12

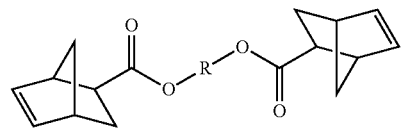

wherein, in Chemical Formula 2-12, R is a single bond, a C1 to C20 alkylene, or a C2 to C20 alkylene wherein at least one methylene (—$CH_2$—) is replaced by sulfonyl (—S(=O)$_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 linear or branched alkyl group), imine (—NR—) (wherein R is hydrogen or a C1 to C10 linear or branched alkyl group), or a combination thereof, Chemical Formula 2-13

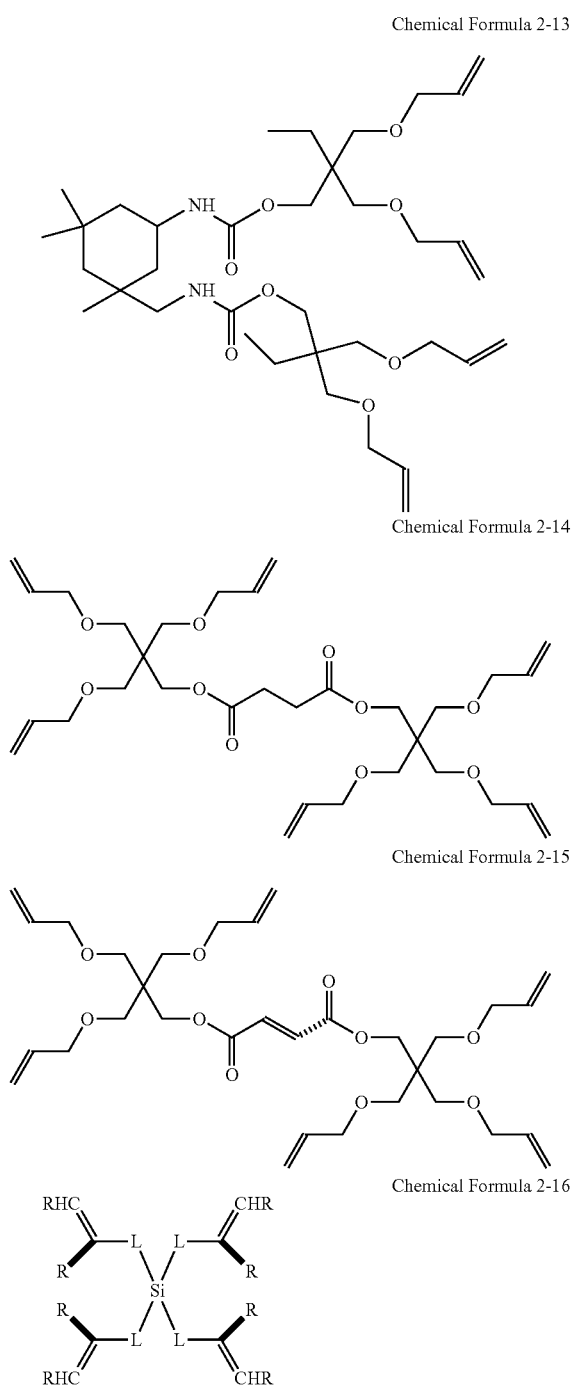

Chemical Formula 2-13

Chemical Formula 2-14

Chemical Formula 2-15

Chemical Formula 2-16 wherein, each L is the same or different and each is independently a single bond, a C1 to C20 alkylene, or a C2 to C20 alkylene wherein at least one methylene (—CH$_2$—) is replaced by sulfonyl (—S(=O)$_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 linear or branched alkyl group), imine (—NR—) (wherein R is hydrogen or a C1 to C10 linear or branched alkyl group), or a combination thereof, and R is the same or different and are independently hydrogen or a methyl group.

The linking group may be formed by a reaction between an Si containing compound (e.g., silsesquioxane compound) substituted with R including at least two carbon-carbon double bonds at the terminal end and a multi-thiol compound having at least two thiol groups.

The multi-thiol compound may include a compound represented by Chemical Formula 1. Details of the multi-thiol compound are the same as described above.

In the formation of the linking group, a ratio between the thiol group and the -ene group may be appropriately controlled. For example, a mole ratio of the thiol group and the -ene group may be about 1:2 (=the number of thiol groups: the number of -ene groups) to about 2:1. For example, an amount of the -ene group per 1 mole of the thiol Group may be greater than or equal to about 0.5 moles or greater than or equal to about 0.6 moles. For example, an amount of the -ene group per 1 mole of the thiol Group may be less than or equal to about 2 moles, less than or equal to about 1.8 moles, less than or equal to about 1.5 moles, or less than or equal to about 1.3 mol.

Figure 4A:
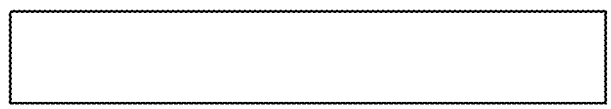
FIG. 4A to 4C are schematic views illustrating various forms of a cross-section of an Si containing layer.

In an embodiment, the silicon containing layer may consist of the silicon oxide, e.g., the silicon containing layer may include a single layer of the SiO$_x$ material(s) (see FIG. 4A). For example, the silicon containing layer may include a single deposition silica layer, a single layer of an organosilicon compound, a single porous silica layer, or a single layer including a combination of at least two thereof.

In another embodiment, the silicon containing layer may include multiple layers, for example may include two or more of a deposition silica layer, a layer of an organosilicone compound, a porous silica layer, or a combination thereof.

Figure 4B:
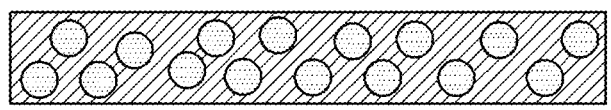
Figure 4C:
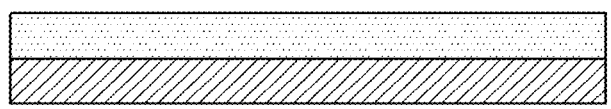

In another embodiment, the silicon containing layer may include a cross-linked polymer. When the silicon containing layer includes the cross-linked polymer, a layer including the cross-linked polymer may be disposed on a surface of the layer including the silicon oxide (e.g., consisting of the silicon oxide) (see FIG. 4C). In other words, the silicon containing layer may be a layered structure including a crosslinked polymer layer and an SiO$_x$ (wherein x is 1 to 2) layer deposited thereon.

A (layered) silicon containing layer having a multi-layer structure may be disposed on the light absorption layer so that a cross-linked polymer layer may contact the first surface of the light absorption layer and a silicon oxide layer (e.g., porous silica layer) may contact the photoluminescence layer. For example, the cross-linked polymer layer may be disposed on (e.g., may contact) the first surface of the light absorption layer, the silicon oxide layer (porous silica layer) may be disposed on (e.g., may contact) the cross-linked polymer layer, and the photoluminescent layer may be disposed on (e.g., may contact) the silicon oxide layer (porous silica layer).

Alternatively, a layered silicon containing layer may be disposed on the light absorption layer so that the silicon oxide layer may contact the first surface of the light absorption layer and the cross-linked polymer layer may contact the photoluminescent layer. For example, the silicon oxide layer (e.g., porous silica layer) may be disposed on (e.g., may contact) the light absorption layer, the cross-linked polymer layer may be disposed on (e.g., may contact) the silicon oxide layer (e.g., porous silica layer), and the photoluminescence polymer layer may be disposed on (e.g., may contact) the cross-linked polymer layer.

The cross-linked polymer layer and the silicon oxide layer may contact each other.

When the silicon containing layer includes the cross-linked polymer, a plurality of silicon oxide particles may be dispersed in the matrix of the cross-linked polymer to form a composite (see FIG. 4B)), and types of the cross-linked polymer are the same as described above. The silicon oxide particles may include or consist of $SiO_x$ (wherein x is 1 to 2).

A thickness of the silicon containing layer is not particularly limited and may be selected considering light transmittance and stability of subsequent processes. In an embodiment, the thickness of the silicon containing layer may be greater than or equal to about 100 nm, for example, greater than or equal to about 200 nm, greater than or equal to about 300 nm, greater than or equal to about 400 nm, or greater than or equal to about 500 nm and less than or equal to about 3 μm or less than or equal to about 2 μm, or less than or equal to about 1 μm. The silicon containing layer may have a lower refractive index than those of the photoluminescent layer and the light absorption layer. For example, the silicon containing layer may have a refractive index of greater than or equal to about 1.2, for example, greater than or equal to about 1.3. The silicon containing layer may have a refractive index of less than or equal to about 1.5, for example, less than or equal to about 1.45.

An Si content of the silicon containing layer may be greater than or equal to about 5 wt %, for example, greater than or equal to about 10 wt %, greater than or equal to about 20 wt %, greater than or equal to about 30 wt %, greater than or equal to about 40 wt %, based on an entire weight of the silicon containing layer. The Si content of the silicon containing layer may be less than or equal to about 90 wt %, for example, less than or equal to about 80 wt %, less than or equal to about 70 wt %, less than or equal to about 60 wt %, less than or equal to about 50 wt %, less than or equal to about 45 wt %, based on a total weight of the silicon containing layer. The Si content of the silicon containing layer may be confirmed by ICP, EDS, and XRF analyses and the like.

The layered structure according to an embodiment may be fabricated in an appropriate method. In an embodiment, a method of manufacturing the layered structure in an embodiment (e.g., on a light transmitting substrate) may include forming a light absorption layer; forming a silicon containing layer on the light absorption layer; and forming a quantum dot polymer composite layer on the silicon containing layer. The obtained layered structure may be patterned as desired.

Details of the light transmitting substrate are the same as described above.

The forming the light absorption layer may include obtaining a composition for a light absorption layer including a precursor (e.g., a monomer) combination for a second polymer matrix and an absorptive color-filter material, coating the composition on the light transmitting substrate in an appropriate method to obtain a film, and curing the film (e.g., by light and/or heat). The thermal curing may be performed at a temperature of greater than or equal to about 100° C. but is not limited thereto. The precursor combination for a second polymer matrix may be appropriately selected depending on a kind of polymer. For example, the precursor combination may include a (meth)acryl-based monomer, a multiple thiol compound, a vinyl-based monomer, an epoxy compound, a urethane compound, a silicon compound, a precursor for polyimide or polyimideamide (e.g., a mixture of aromatic or aliphatic tetracarboxylic acid dianhydride with aromatic or aliphatic diamine, a polyamic acid compound, or all of them), or a combination thereof. These monomers/compounds may be commercially available or may be synthesized.

A method of forming the silicon containing layer on the light absorption layer may vary with the composition of the silicon containing layer. For example, when the silicon containing layer is a deposition $SiO_x$ (wherein x is 1 to 2), the silicon containing layer may be formed by a deposition method such as physical vapor deposition or chemical vapor deposition. Physical vapor deposition may be performed by a thermal vacuum method, a sputtering method, and/or an electron beam method. The physical vapor deposition may be performed by a commercially available apparatus and a known method considering kinds of deposition materials/thickness. An atmosphere, a temperature, a target material, and a vacuum degree of the deposition may be appropriately selected and is not particularly limited. A manner of the chemical vapor deposition is not particularly limited and may be appropriately selected. The chemical vapor deposition may be performed by manners of normal pressure CVD, low pressure CVD, ultra high vacuum CVD, plasma CVD, and the like, but is not limited thereto. The chemical deposition may be performed by a commercially available apparatus and a known method considering the types of deposition materials/thickness. An atmosphere, a temperature, types of gases, and a vacuum degree of the deposition may be appropriately selected and is not particularly limited.

When the silicon containing layer includes an organosilicone compound, the silicon containing layer may be formed for example by preparing a composition including an appropriate precursor (e.g., a silsesquioxane precursor), coating the composition on the light absorption layer to obtain a film, and curing it. When the organosilicon compound includes at least two silsesquioxane structural units linked by a linking group including a bond between sulfur and carbon, a composition including the above thiol substituted (or carbon-carbon unsaturated bond-including) silsesquioxane compound and an -ene compound (or a multiple thiol compound) may be prepared and used.

The forming of a photoluminescent layer including a quantum dot polymer composite on or over the silicon containing layer may include preparing a quantum dot photo resist composition (hereinafter, referred to be a QD PR composition) including a plurality of quantum dot, a photopolymerizable compound including at least two polymerizable moieties, a carboxylic acid linear polymer (e.g., a binder), a photoinitiator, and an organic solvent, coating the QD PR composition on the silicon-containing layer to obtain a QD PR film, exposing the QD PR film to light to perform a cross-linking polymerization in an exposed region, and forming a layer of a quantum dot polymer composite dispersed in a polymer matrix.

A quantum dot-polymer composite pattern may be obtained by exposing a predetermined region of the obtained film (e.g., under a mask) and removing unexposed region from the film using an alkali aqueous solution. The obtained pattern may be heated at a predetermined temperature (e.g., a temperature of greater than or equal to about 160° C.). The composition may be coated on a light transmitting substrate by an appropriate method (e.g., spin coating) to form a film. The formed film may be subjected to pre-baking as desired. The pre-baking may be performed at a temperature of less than or equal to about 130° C., for example, about 90° C. to about 120° C. A time of the pre-baking is not particularly limited and may be appropriately selected. For example, the pre-baking may be performed for greater than or equal to about 1 minute and less than or equal to about 60 minutes, but is not limited thereto. The pre-baking may be performed under a predetermined atmosphere (e.g., air, oxygen-free atmosphere, inert gas atmosphere), is not particularly limited thereto.

In the exposed region, a cross-linking polymerization occurs and forms the quantum dot polymer composite dispersed in the polymer matrix. The quantum dot polymer composite film is treated with an alkali aqueous solution to remove an unexposed region from the film and obtain a pattern of the quantum dot polymer composite. The QD PR composition may be developed with an alkali aqueous solution and thus form the quantum dot-polymer composite pattern without using an organic solvent developing solution. The quantum dot, the photopolymerizable compound, the carboxylic acid group-containing polymer (binder), the transmissive substrate, the polymer matrix, and the quantum dot-polymer composite are the same as described above.

Figure 5:
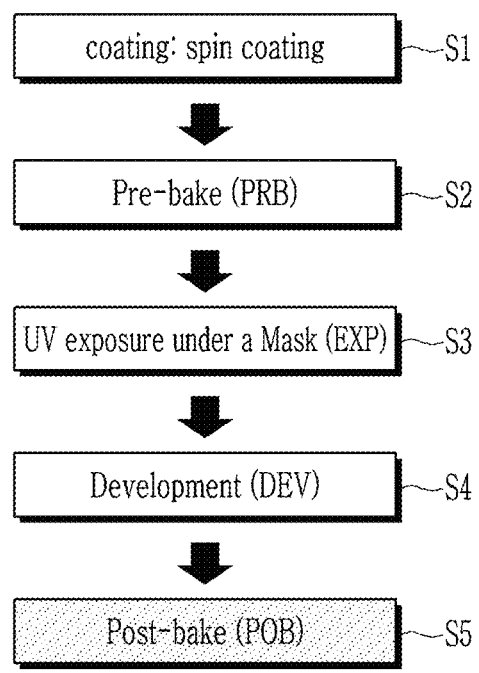
FIG. 5 shows a process of forming a photoluminescent layer including a quantum dot-polymer composite pattern on a substrate in a layered structure according to an embodiment.
Figure 5:
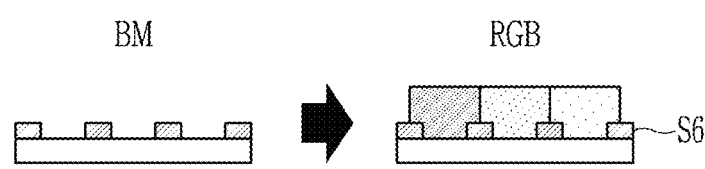

A non-limiting method of forming a pattern is explained referring to FIG. 5. The composition is coated on a structure including a substrate/a light absorption layer/an Si containing layer with a predetermined thickness (e.g., a thickness of about 3 μm to about 30 μm) using an appropriate method such as spin coating or slit coating to form a film. The formed film may be pre-baked, if desired. The formed (or optionally pre-baked) film is exposed to light having a predetermined wavelength under a mask having a predetermined pattern. A wavelength and intensity of the light may be selected considering kinds and contents of the photoinitiator, kinds and contents of the quantum dots, and the like. The exposed film is treated (e.g., dipped or sprayed) with an alkali developing solution and thus an unexposed part of the film is dissolved to form the quantum dot polymer composite pattern. The obtained pattern may be post-baked (S5), if desired, to improve crack resistance and solvent resistance of the pattern, for example, at a temperature of about 150° C. to about 230° C. for a predetermined time, for example, greater than or equal to about 10 min or greater than or equal to about 20 min.

As desired, the pattern forming process may be repeated at least twice so that the quantum dot polymer composite pattern of the photoluminescent layer may have a plurality of sections (e.g., a first section, a second section, and optionally a third section).

The light absorption layer composition, the organosilicon compound-containing composition, and the quantum dot composition (hereinafter, referred to as a composition) may include a photoinitiator. Types of the photoinitiator are not particularly limited, and may be selected appropriately. For example, the available photoinitiator may include a triazine-based compound, an acetophenone-based compound, a benzophenone-based compound, a thioxanthone-based compound, a benzoin-based compound, an oxime-based compound, or a combination thereof, but the available photoinitiator is not limited thereto.

Examples of the triazine-based compound may include 2,4,6-trichloro-s-triazine, 2-phenyl-4,6-bis(trichloro methyl)-s-triazine, 2-(3',4'-dimethoxy styryl)-4,6-bis(trichloro methyl)-s-triazine, 2-(4'-methoxy naphthyl)-4,6-bis(trichloro methyl)-s-triazine, 2-(p-methoxy phenyl)-4,6-bis(trichloro methyl)-s-triazine, 2-(p-tolyl)-4,6-bis(trichloro methyl)-s-triazine, 2-biphenyl-4,6-bis(trichloro methyl)-s-triazine, 2,4-bis(trichloro methyl)-6-styryl-s-triazine, 2-(naphthol-yl)-4,6-bis(trichloro methyl)-s-triazine, 2-(4-methoxy naphthol-yl)-4,6-bis(trichloro methyl)-s-triazine, 2,4-trichloro methyl(piperonyl)-s-triazine, or 2,4-trichloro methyl (4'-methoxy styryl)-s-triazine but the triazine-based compound is not limited thereto.

Examples of the acetophenone-based compound may be 2,2'-diethoxy acetophenone, 2,2'-dibutoxy acetophenone, 2-hydroxy-2-methyl propiophenone, p-t-butyl trichloro acetophenone, p-t-butyl dichloro acetophenone, 4-chloro acetophenone, 2,2'-dichloro-4-phenoxy acetophenone, 2-methyl-1-(4-(methylthio)phenyl)-2-morpholino propan-1-one, 2-benzyl-2-dimethyl amino-1-(4-morpholino phenyl)-butan-1-one, but are not limited thereto.

Examples of the benzophenone-based compound may be benzophenone, benzoyl benzoate, methyl benzoyl benzoate, 4-phenyl benzophenone, hydroxy benzophenone, (meth)acrylated benzophenone, 4,4'-bis(dimethyl amino)benzophenone, 4,4'-dichloro benzophenone, 3,3'-dimethyl-2-methoxy benzophenone, but are not limited thereto.

Examples of the thioxanthone-based compound may be thioxanthone, 2-methyl thioxanthone, 2-isopropyl thioxanthone, 2,4-diethyl thioxanthone, 2,4-diisopropyl thioxanthone, 2-chloro thioxanthone, and the like, but are not limited thereto.

Examples of the benzoin-based compound may include benzoin, benzoin methyl ether, benzoin ethyl ether, benzoin isopropyl ether, benzoin isobutyl ether, or benzyl dimethyl ketal, but are not limited thereto.

Examples of the oxime-based compound may include 2-(o-benzoyloxime)-1-[4-(phenylthio)phenyl]-1,2-octandione and 1-(o-acetyloxime)-1-[9-ethyl-6-(2-methylbenzoyl)-9H-carbazol-3-yl]ethanone, but are not limited thereto.

The photoinitiator may also be a carbazole-based compound, a diketone compound, a sulfonium borate-based compound, a diazo-based compound, a biimidazole-based compound, and the like, in addition to the above photoinitiator.

The composition may include a solvent. The solvent may be appropriately selected considering an affinity for other components in the composition (e.g., a carboxylic acid group-containing polymer, a photopolymerizable compound, a photoinitiator, other additives, and the like), (as desired, affinity for an alkali developing solution), a boiling point, and the like. The composition may include the solvent in a balance amount except for the amounts of desired solids (non-volatile powder).

Non-limiting examples of the solvent may include ethylene glycols such as ethyl 3-ethoxy propionate; ethylene glycol, diethylene glycol, or polyethylene glycol; glycolethers such as ethylene glycolmonomethylether, ethylene glycolmonoethylether, diethylene glycolmonomethylether, ethylene glycoldiethylether, or diethylene glycoldimethylether; glycolether acetates such as ethylene glycol acetate, ethylene glycolmonoethylether acetate, diethylene glycolmonoethylether acetate, or diethylene glycolmonobutylether acetate; propylene glycols such as propylene glycol; propylene glycolethers such as propylene glycolmonomethylether, propylene glycolmonoethylether, propylene glycolmonopropylether, propylene glycolmonobutylether, propylene glycoldimethylether, dipropylene glycoldimethylether, propylene glycoldiethylether, or dipropylene glycoldiethylether; propylene glycoletheracetates such as propylene glycolmonomethyl ether acetate (PGMEA), or dipropylene glycolmonoethylether acetate; amides such as N-methylpyrrolidone, dimethyl formamide, or dimethyl acetamide; ketones such as methylethylketone (MEK), methylisobutylketone (MIBK), or cyclohexanone; petroleum products (hydrocarbons) such as toluene, xylene, or solvent naphtha; esters such as ethyl acetate, butyl acetate, or ethyl lactate; ethers such as diethyl ether, dipropyl ether, or dibutyl ether, or a mixture thereof.

If desired, the composition (photosensitive composition may further include various additives such as a light diffusing agent, a leveling agent, or a coupling agent in addition to the aforementioned components. The amount of the additive is not particularly limited, and may be controlled within an appropriate range wherein the additive does not cause an adverse effect on the composition and the pattern obtained therefrom.

Each amount of the components in the composition is not particularly limited and may be controlled considering compositions of desirable light absorption layer, silicon containing layer, and quantum dot polymer composite.

In an embodiment, an electronic device includes the layered structure. The electronic device may be a display device (e.g., liquid crystal display (LCD) or OLED display device), an organic electroluminescent device, a micro LED device, a light emitting diode (LED), an image sensor, or an IR sensor.

Figure 6A:
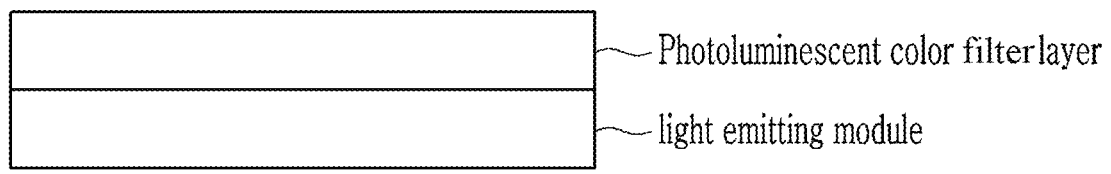
FIG. 6A is a schematic cross-sectional view of a display device according to an embodiment.

An embodiment provides a display device including the layered structure. The display device includes a light source (e.g., light emitting module) and a photoluminescent color filter (C/F) layer disposed on the light source. The photoluminescent color filter layer includes the layered structure. The light source (e.g., light emitting module) is configured to provide the photoluminescent color filter layer with incident light (see FIG. 6A). The display device may exhibit color reproducibility of greater than or equal to about 80%, based on a DCI reference and conversion efficiency (CE) of greater than or equal to about 20%.

Figure 6B:
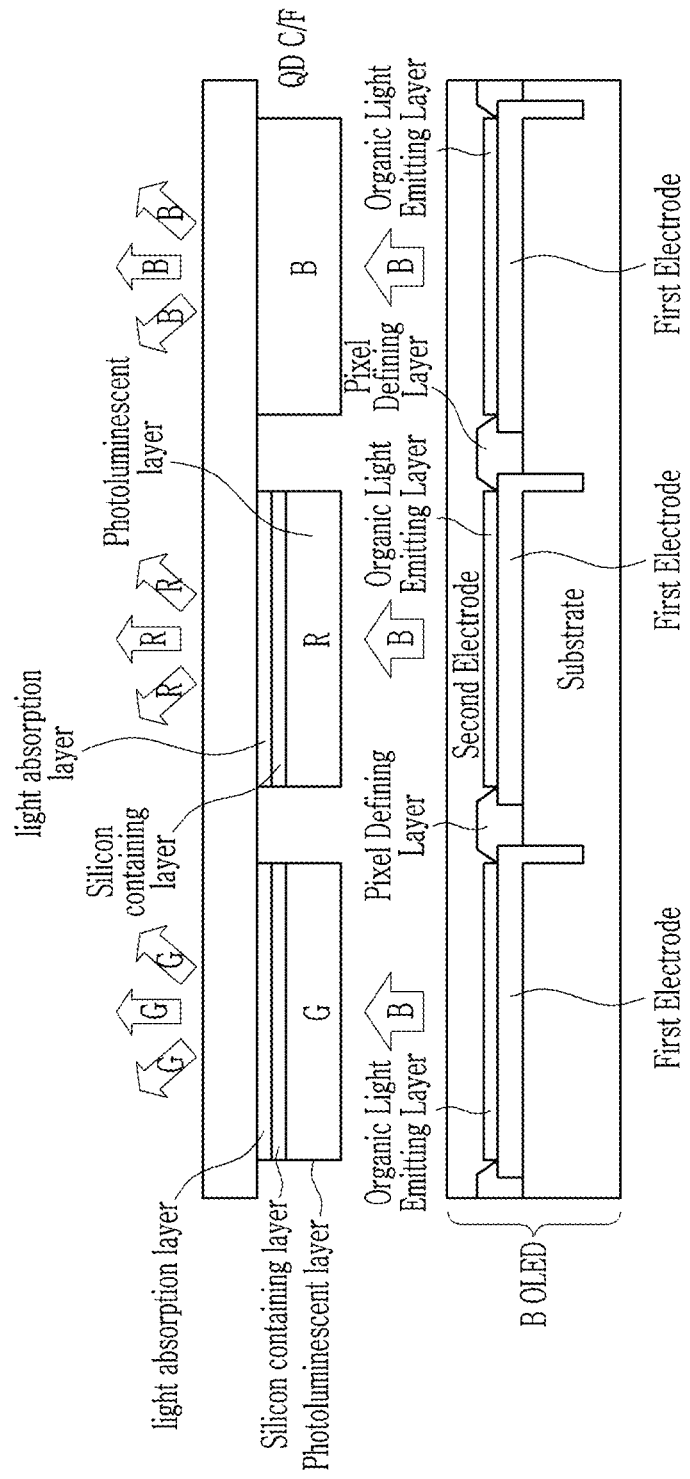
FIG. 6B is a schematic cross-sectional view of a display device according to an embodiment.

The display device may be a display device including an electroluminescent element (e.g., organic light emitting diode (OLED)) as a light source (e.g., light emitting module). Herein, the light emitting module includes a plurality of light emitting unit respectively corresponding to the first section and the second section, and the light emitting unit may include a first electrode and a second electrode facing each other and an emission layer disposed between the first and second electrodes (see FIG. 6B).

Each light emitting unit of the light emitting module provides excitation light (e.g., blue light) for the photoluminescent color filter layer, and the first section (e.g., R section) and the second section (e.g., G section) of the photoluminescent color filter layer respectively emits first light (R light) and second light (G light). Each light emitting unit is controlled by a thin film transistor (TFT) and may respectively emit but is not limited thereto. The thin film transistor has no particular limit in terms of a structure and material.

The light source (e.g., a light emitting module) may further include a charge auxiliary layer (e.g., a charge transport layer, a charge injection layer, or a combination thereof) between the first electrode and the emission layer, between the second electrode and the emission layer, or all of them. When the first electrode is a cathode, the second electrode may be an anode. When the first electrode is an anode, the second electrode may be a cathode.

The organic light emitting diode OLED may include at least two pixel electrodes (e.g., a first electrode) formed on a substrate, a pixel defining layer formed between the adjacent pixel electrodes, an organic light emitting layer formed on the pixel electrodes, and a common electrode layer (e.g., a second electrode) formed on the organic light emitting layer.

Types of the charge auxiliary layer may be different depending on a kind of electrode. Between the cathode and the emission layer, an electron transport layer, an electron injection layer, a hole blocking layer, or a combination thereof may be provided. Between the anode and the emission layer, a hole transport layer, a hole injection layer, an electron blocking layer, or a combination thereof may be disposed.

Each light emitting unit of the light emitting module may include an organic electroluminescent diode. The organic electroluminescent diode has no particular limit in terms of a structure and a material.

The device may be fabricated by separately preparing the layered structure and the OLED (for example, the blue OLED), respectively, and combining them. The device may be fabricated by directly forming the photoluminescent layer (e.g., a pattern of a quantum dot-polymer composite including R section and G section) over the OLED (e.g., the second electrode).

In an embodiment, the display device may be a liquid crystal display (LCD). FIG. 6C shows an embodiment of a liquid crystal display (LCD). The liquid crystal display (LCD) further includes a lower substrate, an upper substrate, a polarizing plate disposed under the lower substrate, and a liquid crystal layer disposed between the upper and lower substrates, wherein the photoluminescent layer is provided on the upper substrate facing the liquid crystal layer, and the light source may be disposed under the polarizing plate.

The light source may include a light emitting element (e.g., light emitting diode (LED)) and optionally a light guide panel.

The display device may further include a polarizer between the lower substrate and the photoluminescent color filter layer.

FIG. 6C is a cross-sectional view of a liquid crystal display according to an embodiment. Referring to FIG. 6C, a photoluminescent liquid crystal display device according to an embodiment includes a liquid crystal panel 200, a polarizing plate 300 disposed under the liquid crystal panel 200, and a backlight unit (BLU) disposed under the polarizing plate 300. The backlight unit includes (e.g., blue) light source 110. The backlight unit may further include a light guide panel 120. The backlight unit may not include a light guide panel 120.

The liquid crystal panel 200 includes a lower substrate 210, an upper substrate 260, a liquid crystal layer 220 disposed between the upper and lower substrates, and a photoluminescent color filter layer provided on the upper substrate. The photoluminescent color filter layer includes the layered structure.

The lower substrate 210 that is also referred to as an array substrate may be a transparent insulation material substrate (e.g., a glass substrate, a polymer substrate including a polyester such as polyethylene terephthalate (PET) or polyethylene naphthalate (PEN), polycarbonate, and/or a polyacrylate, inorganic material substrate of a polysiloxane, $Al_2O_3$, or ZnO. A wire plate 211 is disposed on the lower substrate 210. The wire plate 211 may include a plurality of gate wires and data wires that define a pixel area, a thin film transistor disposed adjacent to a crossing region of gate wires and data wires, and a pixel electrode for each pixel area, but is not limited thereto. Details of such a wire plate are not particularly limited.

The liquid crystal layer 220 may be disposed on the wire plate 211. The liquid crystal layer 220 may include an alignment layer 221 on and under the liquid crystal layer 220 to initially align the liquid crystal material included therein. Details (e.g., a liquid crystal material, an alignment layer material, a method of forming liquid crystal layer, a thickness of liquid crystal layer, or the like) of the liquid crystal material and the alignment layer are not particularly limited.

A lower polarizing plate 300 is provided under the lower substrate. Materials and structures of the polarizing plate 300 are not particularly limited. A backlight unit (e.g., emitting blue light) may be disposed under the polarizing plate 300. An upper optical element or an upper polarizer 300 may be provided between the liquid crystal layer 220 and the upper substrate 260, but is not limited thereto. For example, the upper polarizer may be disposed between a liquid crystal layer 220 (or a common electrode 231) and a photoluminescent layer 230. The polarizing plate 300 may be a suitable polarizer that may be used in a liquid crystal display device. The polarizer may be TAC (triacetyl cellulose) having a thickness of less than or equal to about 200 µm, but is not limited thereto. In an embodiment, the upper optical element may be a coating that controls a refractive index without a polarization function.

The backlight unit may include a light emitting element (e.g., LED) that emits excitation light. In an embodiment, the backlight unit may be an edge-type lighting. For example, the backlight unit may include a reflector (not shown), a light guide panel (not shown) provided on the reflector and providing a planar light source with the liquid crystal panel 200, and/or at least one optical sheet (not shown) on the light guide panel, for example, a diffusion plate, a prism sheet, and the like, but is not limited thereto. In an embodiment, the backlight unit may be a direct lighting. For example, the backlight unit may have a reflector, and may have a plurality of fluorescent lamps disposed on the reflector at regular intervals, or may have an LED operating substrate on which a plurality of LEDs may be disposed, a diffusion plate thereon, and optionally at least one optical sheet. Details (e.g., each component of light guide and various optical sheets, a reflector, and the like) of such a backlight unit are not particularly limited.

The upper substrate 260 may be the aforementioned light transmitting substrate. The layered structure is provided on a bottom surface of the upper substrate. For example, the light absorption layer 250 may be provided on a bottom surface of the upper substrate, the Si containing layer 240 may be disposed on the light absorption layer, and the photoluminescent layer 230 may be disposed on the Si containing layer. A black matrix 232 is provided under the Si containing layer and has an opening and hides the gate line, the data line, and the thin film transistor of the wire plate the lower substrate. For example, the black matrix 232 may have a lattice shape. In openings of the black matrix 232, a photoluminescent layer 230 including a first section (R) configured to emit light (e.g., red light) in a first peak wavelength, a second section (G) configured to emit light (e.g., green light) in a second peak wavelength, and a third section (B) configured to emit/transmit for example blue light may be provided. If desired, the photoluminescent color filter layer may further include at least one of a fourth section. The fourth section may include a quantum dot emitting different colors (e.g., cyan, magenta, and yellow) from the light emitted from the first to third sections.

In the photoluminescent color filter layer 230, sections forming a pattern may be repeated corresponding to pixel areas formed on the lower substrate. A transparent common electrode 231 may be provided on the photoluminescent color filter layer.

The third section (B) configured to emit/transmit blue light may be a transparent color filter that does not change a light emitting spectrum of the light source. In this case, blue light emitted from the backlight unit may enter in a polarized state and may be emitted through the polarizer and the liquid crystal layer as is. If desired, the third section may include quantum dots emitting blue light.

The display device may further include an optical filter layer (e.g., red/green light or yellow light recycling layer) that is disposed between the photoluminescent layer 230 (e.g., the quantum dot polymer composite layer) and the liquid crystal layer 220 (or the upper polarizer 300). The optical filter layer may transmit at least a portion of a third light (e.g., excitation light), and reflect at least a portion of a first light and/or a second light. The optical filter layer may reflect light having a wavelength of greater than 500 nm. The first light may be green (or red) light, the second light may be red (or green) light, and the third light may be blue light.

Hereinafter, the embodiments are illustrated in more detail with reference to examples. However, they are exemplary embodiments of the present invention, and the present invention is not limited thereto.

EXAMPLES

Measurement Method:
1. Luminous efficiency (specifically, quantum yield (QY)), light conversion rates (also referred to as conversion efficiency (CE)), and process maintenance rates are obtained as follows:

A blue light conversion rate of the layered structure comprising a quantum dot composite film is obtained by inserting the manufactured layered structure between a light guide panel and an optical sheet of 60-inch television (TV) equipped with a blue light emitting diode (LED) having a peak wavelength of 449 nm, operating the TV to analyze light emitting characteristics with a spectroradiometer (CS-2000, Konica Minolta Co.) positioned 45 centimeters (cm) away from the TV, obtain a spectrum of light emitted from the TV, and obtain a photoluminescence (PL) spectrum of emitted light.

The total light dose (B) of the excitation light is obtained by integrating the PL spectrum, the PL spectrum of the quantum dot composite film is measured, a dose (A) of green light emitted from the quantum dot composite film and a dose (B') of blue light are obtained.

Luminous efficiency and light conversion rate are as follows.

$$A/B \times 100 = \text{luminous efficiency (QY, \%)}$$

$$A/(B-B') \times 100 = \text{conversion efficiency (\%)}$$

2. A process maintenance rate is a ratio of a light conversion efficiency (CE, %) after the process relative to light conversion efficiency (CE, %) before the process. For example, a process maintenance rate is a ratio of a light conversion efficiency after POB to a light conversion efficiency before POB (i.e., a light conversion efficiency after PRB).
3. Time-of-Flight Secondary Ion Mass Spectrometry (TOF-SIMS) Analysis TOF-SIMS V (ION-TOF GmbH, Germany) mounted with a 25 kiloelectronvolts (keV) Bi+ ion gun is used to perform a TOF-SIMS analysis.
4. Scanning Transmission Electron Microscope (STEM) High Angle Annular Dark Field (HAADF) Analysis HAADF analysis is performed using STEM (TITAN-80-300, FEI).

Reference Example 1: Preparation of Quantum Dot (1) 0.2 millimoles (mmol) of indium acetate, 0.6 mmol of palmitic acid, and 10 milliliters (mL) of 1-octadecene are put in a reactor and heated at 120° C. under vacuum. After 1 hour, an atmosphere in the reactor is converted into nitrogen. The reactor is heated at 280° C., a mixed solution of tris(trimethylsilyl)phosphine ((TMS)$_3$P, 0.1 mmol) and tri-octylphosphine (0.5 mL) is rapidly injected thereinto, and the mixture is reacted for 20 minutes. Subsequently, the reaction solution is rapidly cooled down to room temperature and acetone is added thereto to occur a precipitate, which is then separated by centrifuging and re-dispersed in toluene. The obtained InP semiconductor nanocrystal shows a UV first absorption maximum wavelength ranging from 420 nanometers (nm) to 600 nm.

0.3 mmol (0.056 grams (g)) of zinc acetate, 0.6 mmol (0.189 g) of oleic acid, and 10 mL of trioctylamine are put in a reaction flask and vacuum-treated at 120° C. for 10 minutes. The reaction flask is heated up to 220° C. after substituting inside of the reaction flask with N$_2$. After adding the toluene dispersion of the InP semiconductor nanocrystal (optical density (OD): 0.15) and a predetermined amount of S/TOP (sulfur dissolved or dispersed in trioctylphosphine, the amount of sulfur: 0.5 mmol) to the reaction flask, the obtained mixture is heated up to 280° C. and reacted for 30 minutes. When the reaction is complete, the reaction mixture is rapidly cooled down to room temperature to obtain a reaction mixture including the InP/ZnS semiconductor nanocrystal.

(2) An excess amount of ethanol is added to the reaction mixture including the InP/ZnS semiconductor nanocrystal, and the mixture is centrifuged. After the centrifuging, a supernatant is removed, and a precipitate therein is dried and dispersed in chloroform or toluene to obtain a quantum dot solution (hereinafter, a QD solution). A UV-vis absorption spectrum of the QD solution is measured. The prepared quantum dot absorbs light in a wavelength range of 350 to 500 nm and emits green light in a wavelength range of 520 to 550 nm.

Reference Example 2

A pigment yellow (Pigment Yellow 138) is dispersed in a (meth)acrylate monomer to prepare a composition for a light absorption layer (hereinafter, a yellow-light absorbing photo resist (YPR) composition). A content of the pigment yellow is 50 wt %, based on a total weight of the composition. The YPR composition is spin-coated on a glass substrate at 500 revolutions per minutes (rpm) for 10 seconds to obtain a film.

The obtained film is dried on a 100° C. hot plate for 2 minutes and then, photocured with ultraviolet (UV) light of 80 millijoules (mJ) and additionally heat-cured again at 230° C. for 30 minutes to obtain a structure (hereinafter, YPR/glass) having a yellow dye-(meth)acrylate polymer composite layer (a thickness: 1 μm) on a glass substrate.

Reference Example 3: Composition for Si-Containing Layer I

A composition for a silicon containing layer (hereinafter, a barrier composition A) is prepared by dissolving 1.7 g of SSQ (silsesquioxane) having a thiol group with a predetermined substitution degree (e.g., 12) (molecular weight (MW): 1780 Daltons, Gelest, Inc.), 0.66 g of triallylisocyanurate (TTT, MW: 249.27 Daltons, Sigma Aldrich Co., Ltd.), and 0.024 g of Irgacure TPOL in 0.78 g of propylene glycolmonomethyl ether acetate (PGMEA).

Reference Example 4: Composition for Si-Containing Layer II

A barrier composition B is prepared according to the same method as Reference Example 3 except for using 0.384 g of tetraallylsilane having four vinyl groups (TAS, MW: 192.38, Gelest, Inc.) instead of TTT.

Reference Example 5: Composition for Non Si-Containing Layer III

A barrier composition C is prepared according to the same method as Reference Example 3 except for using 0.94 g of ethylene glycol di(3-mercaptopropionate) (GDMP, THIO-CURE®) instead of SSQ.

Reference Example 6: Preparation of Composition for Quantum Dot-Polymer Composite 1. Preparation of Quantum Dot-Binder Dispersion A chloroform dispersion of the synthesized quantum dots (InP/ZnS core-shell, green light emitting) including oleic acid as a hydrophobic organic ligand on a surface thereof in Reference Example 1 is prepared. The chloroform dispersion including 50 g of the quantum dots is mixed with 100 g of a binder (a quaternary copolymer of methacrylic acid, benzyl methacrylate, 2-hydroxyethyl methacrylate, and styrene (a mole ratio=61.5:12:16.3:10.2), an acid value: 130 milligrams of potassium hydroxide (KOH) per gram (mg KOH/g), a number average molecular weight: 8000) solution (solvent: propylene glycol monomethyl ether acetate having a concentration of 30 weight percent (wt %)) to prepare a quantum dot-binder dispersion. It is confirmed that the quantum dots are uniformly dispersed in the prepared quantum dot-binder dispersion.

2. Preparation of Photosensitive Composition

To the quantum dot-binder dispersion prepared in 1., 100 g of hexaacrylate having the following structure as a photopolymerizable monomer, an oxime ester compound as an initiator, 30 g of TiO$_2$ as a light diffusing agent (an average particle size: 200 nm), and 300 g of PGMEA as a solvent are added to obtain a photosensitive composition (hereinafter, referred to as a QDPR composition).

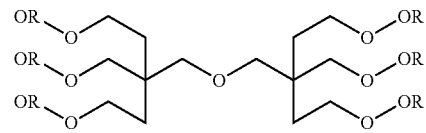

wherein

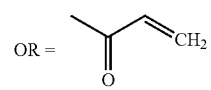

It is confirmed that the prepared composition may form dispersion without showing any noticeable agglomeration due to the addition of the quantum dots.

Preparation of Layered Structure

Example 1

A silicon containing layer (a thickness: 1 micrometer (μm)) is formed by coating the barrier composition A according to Reference Example 3 on the YPR/glass prepared according to Reference Example 2 at 4000 rpm for 5 seconds and then, photocuring the barrier composition A with UV light of 80 mJ and drying at 180° C. to remove a solvent for 10 minutes.

On the silicon containing layer, the QD PR composition according to Reference Example 6 is spin-coated at 160 rpm for 5 seconds and heat-treated or pre-baked (PRB) on a 100° C. hot plate. The PRB-treated film is photocured with UV light of 80 mJ and heat-treated or post baked (POB) at 180° C. for 30 minutes under a $N_2$ atmosphere. Accordingly, a layered structure (QD-PR (6 µm)/Si-containing layer (1 µm)/YPR (1 µm)/glass) having a photoluminescent layer (a thickness: 6 µm) including a quantum dot polymer composite is obtained.

Example 2

A layered structure (QD-PR (6 µm)/Si-containing layer (1 µm)/YPR (1 µm)/glass) is obtained according to the same method as Example 1 except for using the barrier composition B instead of the barrier composition A.

Example 3

A layered structure (QD-PR (6 µm)/Si-containing layer (500 nm)/YPR (1 µm)/glass) is obtained according to the same method as Example 1 except for forming a $SiO_2$ layer (thickness: 500 nm) on the YPR/glass according to Reference Example 2 through sputtering (temperature: room temperature, atmosphere: oxygen, target: $SiO_2$, purity: 99.99%) instead of using the barrier composition A.

Example 4

A layered structure (QD-PR (6 µm)/Si-containing layer (1 µm)/YPR (1 µm)/glass) is obtained according to the same method as Example 1 except for forming a layered silicon containing layer in the following manner on the YPR/glass according to Reference Example 2 instead of using the barrier composition A:

A cross-linked polymer layer is formed by spin-coating a multi-functional acrylate monomer-containing coating liquid on the YPR/glass according to Reference Example 2 to form a film and then, heat-treating the film at 100° C. for 2 minutes and photocuring the film with UV light of 80 mJ at 180° C. for 30 minutes. On the cross-linked polymer layer, a low refractive layer is formed via a spin-coating of a TEOS-containing silica precursor and a subsequent heat-treatment at 140° C. for 30 minutes to obtain a layered silicon containing layer (a thickness: 1 µm).

Example 5

A layered structure (QD-PR (6 µm)/Si-containing layer (1 µm)/YPR (1 µm)/glass) is obtained according to the same method as Example 1 except for spin-coating a TEOS-containing silica precursor solution instead of the barrier composition A and heat-treating it at 140° C. for 30 minutes to form a porous silica layer.

Comparative Example 1

A layered structure (QD-PR (6 µm)/YPR (1 µm)/glass) having a quantum dot polymer composite-containing photoluminescent layer on the YPR/glass according to Reference Example 2 is obtained according to the same method as Example 1 except for forming no silicon containing layer by using the barrier composition A.

Comparative Example 2

A layered structure (QD-PR (6 µm)/ZnO-containing layer (500 nm)/YPR (1 µm)/glass) is obtained according to the same method as Example 1 except for forming a ZnO layer (a thickness: 500 nm) on the YPR/glass according to Reference Example 2 instead of using the barrier composition A through sputtering (temperature: room temperature, atmosphere: oxygen, target: ZnO, purity: 99.99%).

Comparative Example 3

A layered structure (QD-PR (6 µm)/$TiO_2$ containing layer (500 nm)/YPR (1 µm)/glass) is obtained according to the same method as Example 1 except for forming a $TiO_2$ layer (a thickness: 500 nm) on the YPR/glass according to Reference Example 2 instead of using the barrier composition A through sputtering (temperature: room temperature, atmosphere: oxygen, target: $TiO_2$, purity: 99.99%).

Comparative Example 4

A layered structure (QD-PR (6 µm)/non Si-containing thiolene cross-linking polymer layer (1 µm)/YPR (1 µm)/glass) is obtained according to the same method as Example 1 except for using the barrier composition C instead of the barrier composition A.

Comparative Example 5

A QD PR composition is spin-coated on a glass substrate at 160 rpm for 5 seconds and heat-treated or prebaked (PRB) on a 100° C. hot plate. The PRB-treated film is photocured with UV light of 80 mJ and then, heat treated or post-baked (POB) under a $N_2$ atmosphere at 180° C. for 30 minutes. Accordingly, a layered structure (QD-PR (6 µm)/glass) having a photoluminescent layer (a thickness: 6 µm) including the quantum dot polymer composite is obtained.

Chemical/Thermal Degradation Phenomenon of Photoluminescent Layer due to Introduction of YPR Experimental Example 1

Time-of-flight secondary Ion mass spectrometry (TOF-SIMS) and High Angle Annular Dark Field (HAADF) analyses are performed regarding the layered structure according to Comparative Example 1 after POB by using TOF-SIMS V (ION-TOF GmbH, Germany) equipped with a 25 keV $Bi^+$ ion gun. The results are shown in FIGS. 7 and 8.

Figure 7:
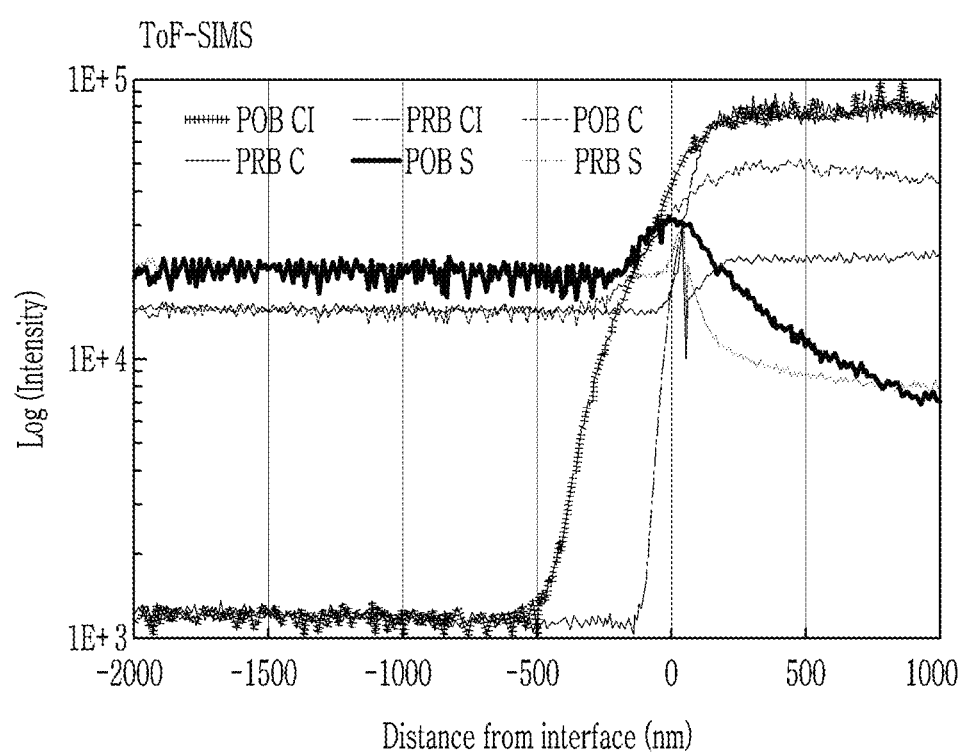
FIG. 7 shows a result of Time-of-Flight Secondary Ion Mass Spectrometry (TOF-SIMS) analysis in Experimental Example 1.
Figure 8:
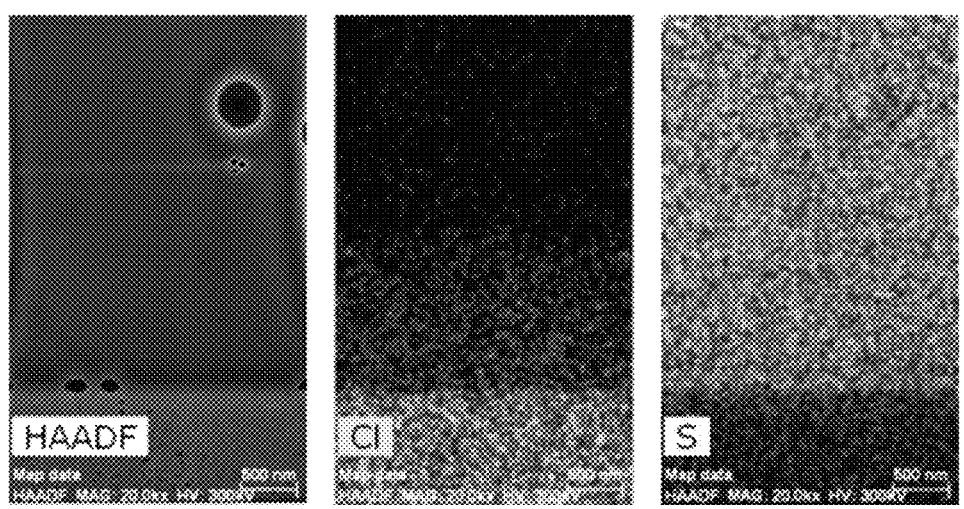
FIG. 8 is a result of High Angle Annular Dark Field (HAADF) analysis in Experimental Example 1.

Referring to the results of FIGS. 7 and 8, in the layered structure of Comparative Example 1, a dye component of the light absorption layer is diffused up to the photoluminescent layer, and a sulfur component from the photoluminescent layer is diffused into the light absorption layer due to the POB heat treatment. This material movement on the interface may have a negative influence on photoluminescence characteristics of quantum dots dispersed in the photoluminescent layer.

Light-Emitting Characteristics of Layered Structure

Experimental Example 2

1. A light conversion rate of the layered structures according to Comparative Examples 1 and 6 after PRB and POB is measured. A photoluminescence spectrum after PRB is shown in FIG. 9.

Figure 9:
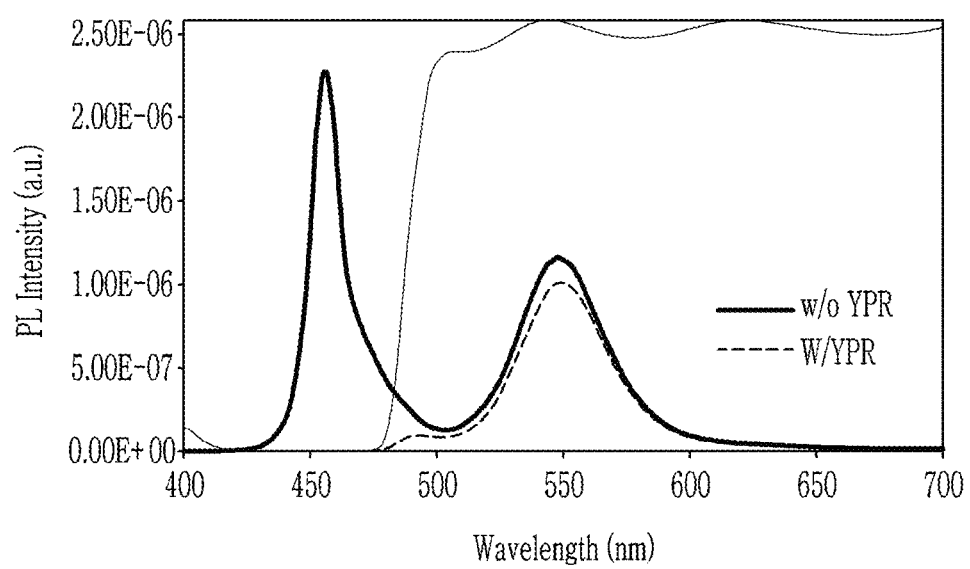
FIG. 9 shows photoluminescence spectra of the layered structure (including a light absorption layer) of Comparative Example 1 and the layered structure (not including a light absorption layer) of Comparative Example 6 as measured in Experimental Example 2.

Referring to the result of FIG. 9, the layered structure (W/YPR) of Comparative Example 1 emits almost no blue light, but the layered structure (w/o YPR) of Comparative Example 6 shows a substantial emission of blue light. Accordingly, the layered structure of Comparative Example 6 may hardly emit light of a desired color coordinate. In addition, the layered structure of Comparative Example 1 may realize color reproducibility of about 87%, but the layered structure of Comparative Example 6 may realize color reproducibility of only 41.2%.

2. Luminous efficiency of the layered structure after PRB is measured. Luminous efficiency after PRB of the layered structure according to Comparative Example 1 shows to be about 77% of the luminous efficiency after PRB of the layered structure according to Comparative Example 6. This result implies that a substantial optical loss may occur due to the light absorption layer.

3. Light conversion rates after PRB and POB of the layered structure are measured to calculate a process maintenance rate about POB. A process maintenance rate of the layered structure according to Comparative Example 1 is only about 88% of that of the layered structure according to Comparative Example 6.

4. Luminous efficiency after POB of the layered structure according to Comparative Example 1 is only about 70% of luminous efficiency after POB of the layered structure according to Comparative Example 6.

The foregoing results show that thermal and chemical stability of the layered structure may be greatly reduced due to the presence of light absorption layer.

Experimental Example 3

1. Luminous efficiency after PRB regarding the layered structures according to Comparative Examples 1 to 4 and Examples 1 to 4 is measured. Based on luminous efficiency of Comparative Example 1, a luminous efficiency difference of each layered structure according to Comparative Examples 1 to 4 and Examples 1 to 4 is calculated and shown in Table 1.

TABLE 1

|  | Luminous efficiency difference after PRB relative to Comparative Example 1 (%) |
|---|---|
| Comparative Example 1 (Ref.) | 0 |
| Example 1 | 1.3 |
| Example 2 | 1.4 |
| Example 3 | 0.8 |
| Example 4 | 3.6 |
| Comparative Example 2 | 0.3 |
| Comparative Example 3 | −0.4 |
| Comparative Example 4 | 0 |

The layered structures according to Examples show improved luminous efficiency after PRB (initial luminous efficiency) compared with the layered structure formed by introducing YPR without a Si-containing layer according to Comparative Example 1. This result shows that in the layered structures of Examples, an optical loss caused by the introduction of a light absorption layer may be reduced/suppressed. The layered structures according to Comparative Examples 2 to 4 include a barrier layer formed of a different composition from that of a Si-containing layer but show almost no optical loss-improving effect, and even a titanium oxide layer shows an increased optical loss.

2. Luminous efficiency after POB of the layered structures according to Comparative Examples 1 to 4 and Examples 1 to 4 are measured. Based on luminous efficiency of Comparative Example 1, a luminous efficiency difference thereof are calculated and shown in Table 1.

Light conversion rates of the layered structures after PRB and POB according to Comparative Examples 1 to 4 and Examples 1 to 4 are measured to calculate a process maintenance rate about POB. The results are shown in Table 2.

TABLE 2

|  | Process maintenance rate (%) | Luminous efficiency difference after POB relative to Comparative Example 1 (%) |
|---|---|---|
| Comparative Example 1 (Ref.) | 88.9 | 0 |
| Example 1 | 99.6 | 3.6 |
| Example 2 | 98.7 | 3.5 |
| Example 3 | 98 | 2.3 |
| Example 4 | 102.7 | 6.3 |
| Comparative Example 2 | 93.9 | 0.8 |
| Comparative Example 3 | 93.7 | 0.1 |
| Comparative Example 4 | 92.2 | 0.8 |

The layered structures of Examples show remarkably improved process maintenance rate and luminous efficiency after POB (final luminous efficiency) compared with the layered structure of Comparative Example 1 into which YPR is introduced without an Si-containing layer. This result implies that due to introduction of the Si-containing layer, the layered structures of Examples show reduced/relieved/suppressed from a chemical/thermal degradation phenomenon and thus a luminous efficiency degradation caused by the introduction of a light absorption layer. Referring to the result of Table 2, the layered structures according to Comparative Examples 2 to 4 include a barrier layer formed of a different composition instead of an Si-containing layer but show still a serious chemical/thermal degradation phenomenon.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising a light source comprising a plurality of light units; and a photoluminescent color filter layer disposed on the light source and comprising a layered structure,
   wherein the layered structure comprises:
   a photoluminescent layer comprising a quantum dot polymer composite;
   a light absorption layer disposed on the photoluminescent layer, the light absorption layer comprising an absorptive color-filter material; and
   a silicon containing layer disposed between the photoluminescent layer and the light absorption layer,
   wherein the quantum dot polymer composite comprises a first polymer matrix and a plurality of quantum dots dispersed in the first polymer matrix,
   wherein the layered structure comprises a first section emitting first light and a second section emitting second light different from the first light,
   wherein the plurality of light units comprises a first light unit corresponding to the first section and supplying excitation light to the first section and a second light unit corresponding to the second section and supplying excitation light to the second section, wherein in the layered structure, the quantum dot polymer composite is patterned to correspond to the first section and the second section, respectively, the silicon containing layer is patterned to correspond to the first section and the second section, wherein the light absorption layer is patterned to have a first absorption section and a second absorption section corresponding to the first section and the second section, respectively, wherein the first absorption section is spaced apart from the second absorption section; and wherein a thickness of the silicon containing layer is greater than or equal to 100 nanometers and less than or equal to 3 micrometers.

2. The display device of claim 1, wherein the silicon containing layer comprises a porous structure of a silicon oxide and does not comprises a quantum dot, and the silicon containing layer has a refractive index of greater than or equal to 1.2 and less than 1.45.

3. The display device of claim 1, wherein the refractive index of the silicon containing layer is lower than each of a refractive index of the light absorption layer and a refractive index of the photoluminescent layer.

4. The display device of claim 1, wherein the plurality of light units comprises an organic light emitting diode.

5. The display device of claim 1, wherein the excitation light comprises blue light, green light, or a combination thereof.

6. The display device of claim 1, wherein the display device further comprises a light transmitting substrate, and wherein the silicon containing layer has a first surface contacting the photoluminescent layer and a second surface opposite to the first surface, the light absorption layer is disposed directly on the second surface of the silicon containing layer, and the light transmitting substrate is disposed on the light absorption layer.

7. The display device of claim 1, wherein the light absorption layer further comprises a second polymer matrix and the absorptive color-filter material is dispersed in the second matrix.

8. The display device of claim 1, wherein
the first absorption section is configured to transmit at least the first light and the second absorption section is configured to transmit at least the second light.

9. The display device of claim 1, wherein the first polymer matrix comprises a cross-linked polymer, a carboxylic acid group-containing binder polymer, or a combination thereof.

10. The display device of claim 1, wherein the plurality of quantum dots comprise a Group II-VI compound, a Group III-V compound, a Group IV-VI compound, a Group IV element or compound, a Group I-III-VI compound, a Group I-II-IV-VI compound, or a combination thereof, based on the Periodic Table, or
wherein the absorptive color-filter material comprises an inorganic pigment, an inorganic dye, an organic pigment, an organic dye, or a combination thereof.

11. The display device of claim 1, wherein the silicon containing layer comprises a porous structure of SiO wherein x is 1 to 2, and the porous structure has silicon oxide micropores.

12. The display device of claim 1, wherein the silicon containing layer comprises a porous silica layer and a first layer comprising a cross-linked polymer, wherein the porous silica layer is disposed directly on the first layer comprising the cross-linked polymer.

13. The display device of claim 1, wherein an amount of the absorptive color-filter material is greater than or equal to 10 wt % and less than or equal to 90 wt %, based on a total weight of the light absorption layer.

14. The display device of claim 1, wherein the silicon containing layer comprises an organosilicon compound comprising a moiety represented by *—Si—O—Si—* wherein * is a linking portion with an adjacent atom, and the organosilicon compound comprises a silsesquioxane structural unit represented by $(RSiO_{3/2})_n$ and having a cage structure, a ladder structure, a polymeric structure, or a combination thereof, wherein n is 1 to 20 and R is hydrogen, a C1 to C30 substituted or unsubstituted aliphatic moiety, a C3 to C30 substituted or unsubstituted alicyclic moiety, a C6 to C30 substituted or unsubstituted aromatic moiety, or a combination thereof.

15. The display device of claim 1, wherein the silicon containing layer has a silicon content of greater than or equal to 10 weight percent and less than or equal to 90 weight percent, based on a total weight thereof.

16. The display device of claim 1, wherein a thickness of the silicon containing layer is less than or equal to 2 micrometers, and
a thickness of the photoluminescent layer is greater than or equal to 2 micrometers and less than or equal to 12 micrometers.

17. The display device of claim 1, wherein the refractive index of the silicon containing layer is in a range of from 1.2 to 1.3.

18. The display device of claim 1, further comprising a micro LED.

19. The display device of claim 1, wherein the layered structure comprises a repeating section, the repeating section comprises a first section configured to emit a first light and a second section configured to emit a second light that is different from the first light, and the light source comprises a light emitting module and the light emitting module comprises a plurality of light emitting units respectively corresponding to the first section and the second section.

20. A display device comprising a light source comprising a plurality of light units; and a photoluminescent color filter layer disposed on the light source and comprising a layered structure,
wherein the layered structure comprises:
a photoluminescent layer comprising a quantum dot polymer composite;
a light absorption layer disposed on the photoluminescent layer, the light absorption layer comprising an absorptive color-filter material; and
a silicon containing layer disposed between the photoluminescent layer and the light absorption layer,
wherein the quantum dot polymer composite comprises a first polymer matrix and a plurality of quantum dots dispersed in the first polymer matrix,
wherein the layered structure comprises a first section emitting first light and a second section emitting second light different from the first light,
wherein the plurality of light units comprises a first light unit corresponding to the first section and supplying excitation light to the first section and a second light unit corresponding to the second section and supplying excitation light to the second section, wherein the silicon containing layer comprises a porous structure of a silicon oxide and does not comprise a quantum dot, and wherein the refractive index of the silicon containing layer is lower than each of a refractive index of the light absorption layer and a refractive index of the photoluminescent layer.

* * * * *